United States Patent
Pang et al.

(10) Patent No.: US 10,128,257 B2
(45) Date of Patent: Nov. 13, 2018

(54) SELECT TRANSISTORS WITH TIGHT THRESHOLD VOLTAGE IN 3D MEMORY

(71) Applicant: SanDisk Technologies LLC, Plano, TX (US)

(72) Inventors: Liang Pang, Fremont, CA (US); Jayavel Pachamuthu, San Jose, CA (US); Yingda Dong, San Jose, CA (US)

(73) Assignee: SanDisk Technologies LLC, Addison, TX (US)

(*) Notice: Subject to any disclaimer, the term of this patent is extended or adjusted under 35 U.S.C. 154(b) by 0 days.

(21) Appl. No.: 15/906,317

(22) Filed: Feb. 27, 2018

(65) Prior Publication Data

US 2018/0190667 A1    Jul. 5, 2018

Related U.S. Application Data

(62) Division of application No. 15/291,871, filed on Oct. 12, 2016, now Pat. No. 9,941,293.

(51) Int. Cl.
*H01L 27/115* (2017.01)
*H01L 27/11519* (2017.01)
(Continued)

(52) U.S. Cl.
CPC .... *H01L 27/11519* (2013.01); *H01L 21/0262* (2013.01); *H01L 21/02532* (2013.01);
(Continued)

(58) Field of Classification Search
CPC ......... H01L 27/11519; H01L 27/11556; H01L 27/1157; H01L 27/11553; H01L 27/11524;
(Continued)

(56) References Cited

U.S. PATENT DOCUMENTS

| 5,793,677 A | 8/1998 | Hu et al. |
| 8,928,061 B2 | 1/2015 | Chien et al. |

(Continued)

FOREIGN PATENT DOCUMENTS

WO    WO2016/089474 A1    6/2016

OTHER PUBLICATIONS

Choi, Yang-Kyu, et al., "Investigation of Gate-Induced Drain Leakage (GIDL) Current in Thin Body Devices: Single-Gate Ultra-Thin Body, Symmetrical Double-Gate, and Asymmetrical Double-Gate MOSFETs," Japan Society of Applied Physics, vol. 42, Part 1, No. 4B, Apr. 2003, pp. 2073-2076.

(Continued)

*Primary Examiner* — Yosef Gebreyesus
(74) *Attorney, Agent, or Firm* — Vierra Magen Marcus LLP

(57) ABSTRACT

Disclosed herein is a 3D memory with a select transistor, and method for fabricating the same. The select transistor may have a conductive floating gate, a conductive control gate, a first dielectric between the conductive floating gate and the conductive control gate, and a second dielectric between a body and the conductive floating gate. In one aspect, a uniform gate dielectric is formed using lateral epitaxial growth in a recess adjacent a crystalline semiconductor select transistor body, followed by forming the gate dielectric from the epitaxial growth. Techniques help to prevent, or at least reduce, a leakage current between the select transistor control gate and the select transistor body and/or the semiconductor substrate below the select transistor. Therefore, select transistors having a substantially uniform threshold voltage, on current, and S-factor are achieved. Also, select transistors have a high on-current and a steep sub-threshold slope.

20 Claims, 32 Drawing Sheets

(51) Int. Cl.
*H01L 21/02* (2006.01)
*H01L 21/28* (2006.01)
*H01L 27/11524* (2017.01)
*H01L 27/11556* (2017.01)
*H01L 27/11565* (2017.01)
*H01L 27/1157* (2017.01)
*H01L 27/11582* (2017.01)
*H01L 29/66* (2006.01)
*H01L 27/1158* (2017.01)
*H01L 27/11553* (2017.01)

(52) U.S. Cl.
CPC .. *H01L 21/28273* (2013.01); *H01L 21/28282* (2013.01); *H01L 27/1157* (2013.01); *H01L 27/1158* (2013.01); *H01L 27/11524* (2013.01); *H01L 27/11553* (2013.01); *H01L 27/11556* (2013.01); *H01L 27/11565* (2013.01); *H01L 27/11582* (2013.01); *H01L 29/66825* (2013.01); *H01L 29/66833* (2013.01)

(58) Field of Classification Search
CPC ......... H01L 27/11565; H01L 27/11582; H01L 27/1158; H01L 21/28282; H01L 21/0262; H01L 21/02532; H01L 21/28273; H01L 29/66825; H01L 29/66833
See application file for complete search history.

(56) References Cited

U.S. PATENT DOCUMENTS

| | | | |
|---|---|---|---|
| 8,947,936 B2 | 2/2015 | Hung et al. | |
| 8,971,119 B2 | 3/2015 | Avila et al. | |
| 9,184,175 B2 | 11/2015 | Dennison et al. | |
| 9,214,351 B2 | 12/2015 | Hsiao et al. | |
| 9,224,474 B2 | 12/2015 | Lue | |
| 9,230,980 B2 | 1/2016 | Rabkin et al. | |
| 9,245,642 B1 | 1/2016 | Chen et al. | |
| 9,331,091 B1 | 5/2016 | Cernea | |
| 2009/0302377 A1* | 12/2009 | Son | H01L 27/108 257/329 |
| 2010/0155818 A1 | 6/2010 | Cho et al. | |
| 2012/0256247 A1 | 10/2012 | Alsmeier | |
| 2013/0182502 A1 | 7/2013 | Cheo et al. | |
| 2014/0353738 A1 | 12/2014 | Makala et al. | |
| 2015/0123182 A1 | 5/2015 | Seo | |
| 2016/0071861 A1 | 3/2016 | Serov et al. | |

OTHER PUBLICATIONS

International Search Report & The Written Opinion of the International Searching Authority dated Dec. 6, 2017, International Application No. PCT/US2017/05044.
U.S. Appl. No. 15/291,871, filed Oct. 12, 2016, by Pang et al.
Restriction Requirement dated May 18, 2017, U.S. Appl. No. 15/291,871, filed Oct. 12, 2016.
Response to Restriction Requirement dated Jun. 7, 2017, U.S. Appl. No. 15/291,871, filed Oct. 12, 2016.
Non-final Office Action dated Jul. 13, 2017, U.S. Appl. No. 15/291,871, filed Oct. 12, 2016.
Response to Office Action dated Sep. 15, 2017, U.S. Appl. No. 15/291,871, filed Oct. 12, 2016.
Final Office Action dated Nov. 29, 2017, U.S. Appl. No. 15/291,871, filed Oct. 12, 2016.
Response to Office Action dated Dec. 6, 2017, U.S. Appl. No. 15/291,871, filed Oct. 12, 2016.
Notice of Allowance dated Nov. 29, 2017, U.S. Appl. No. 15/291,871, filed Oct. 12, 2016.

* cited by examiner

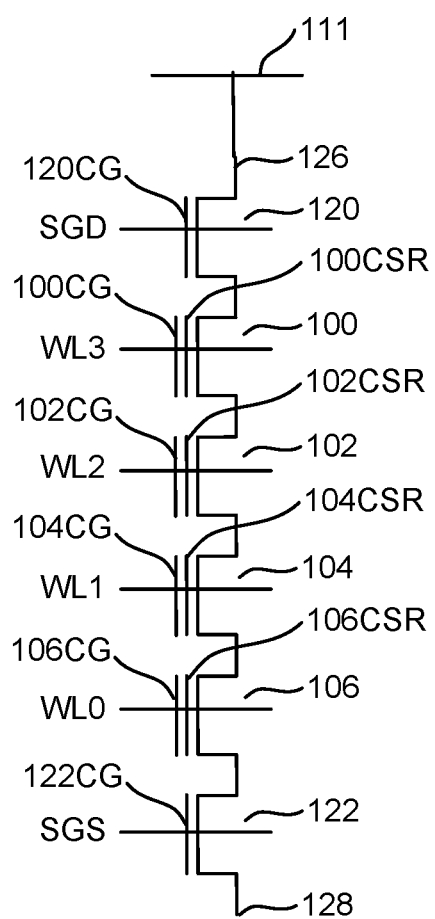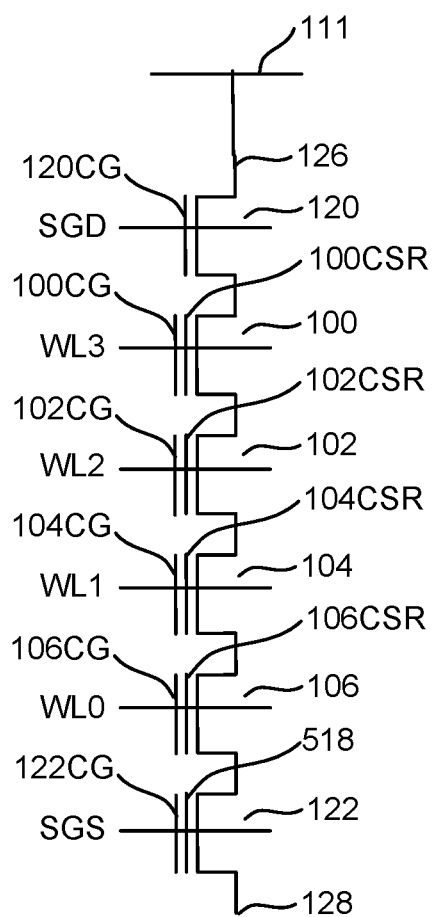

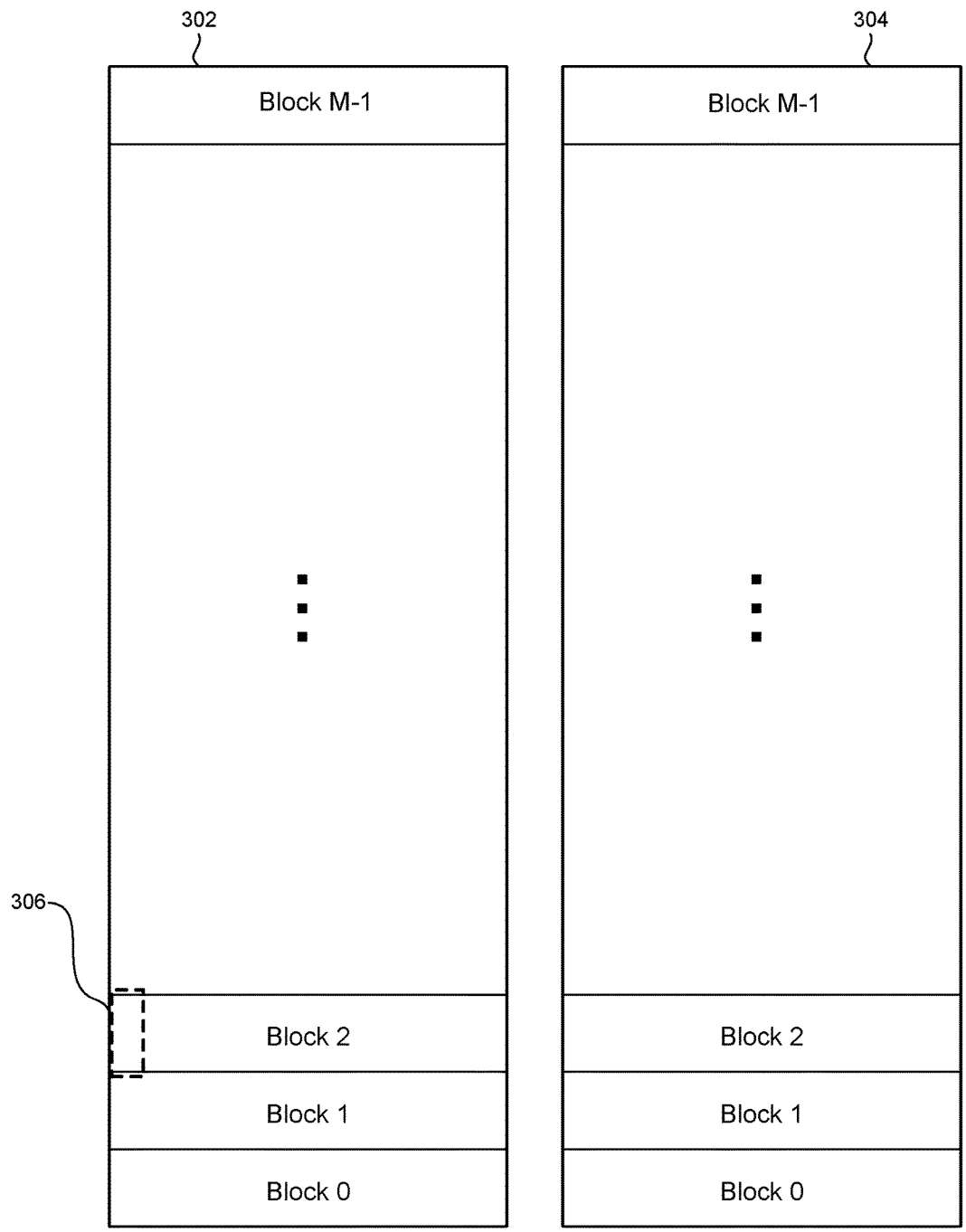

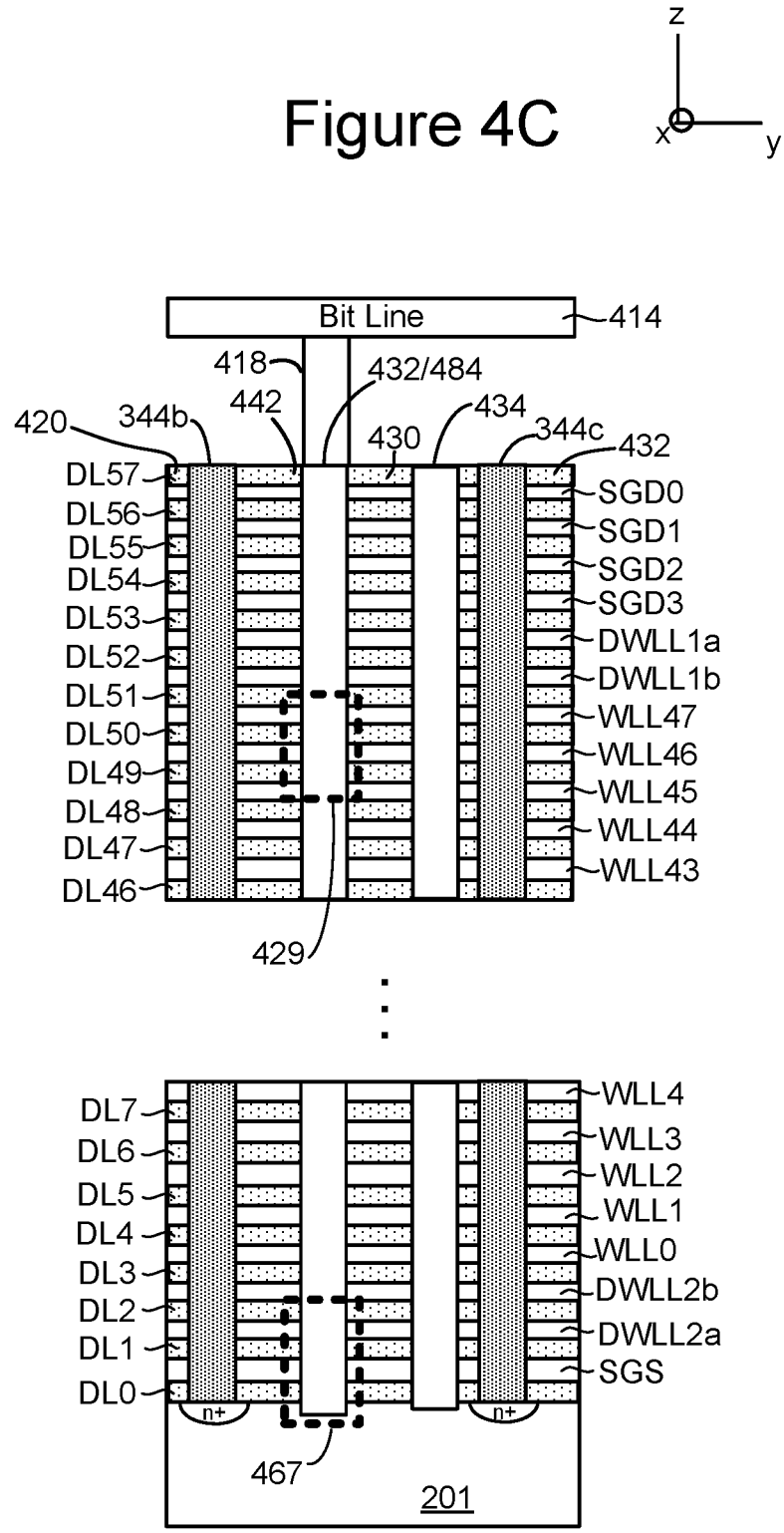

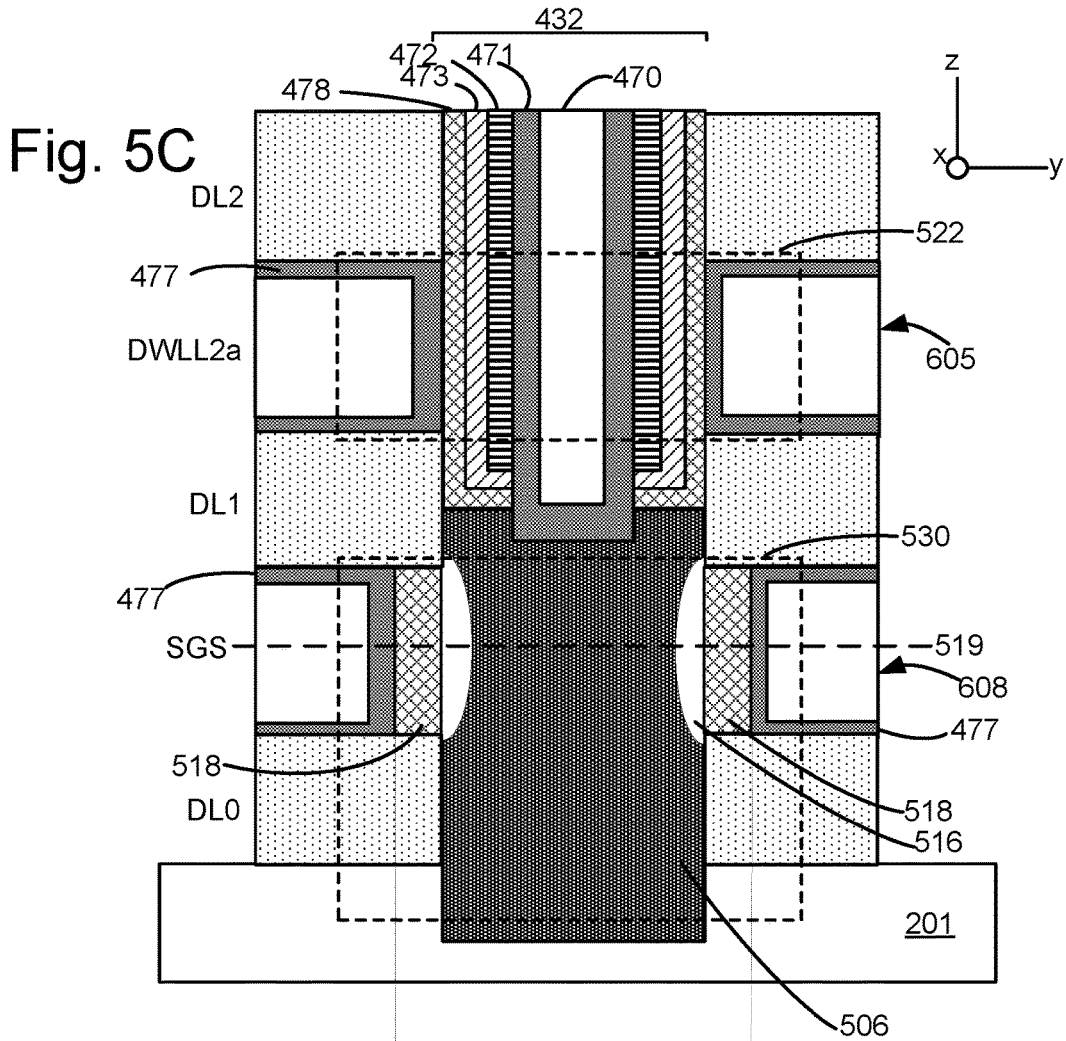
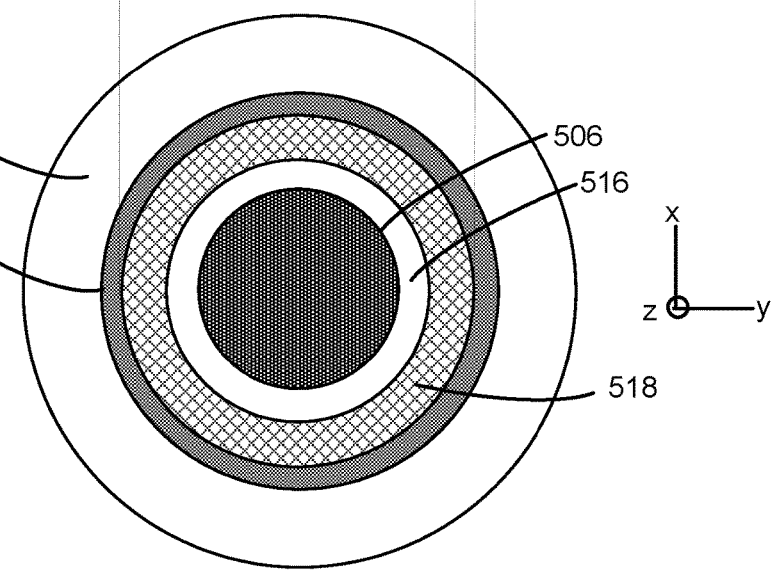

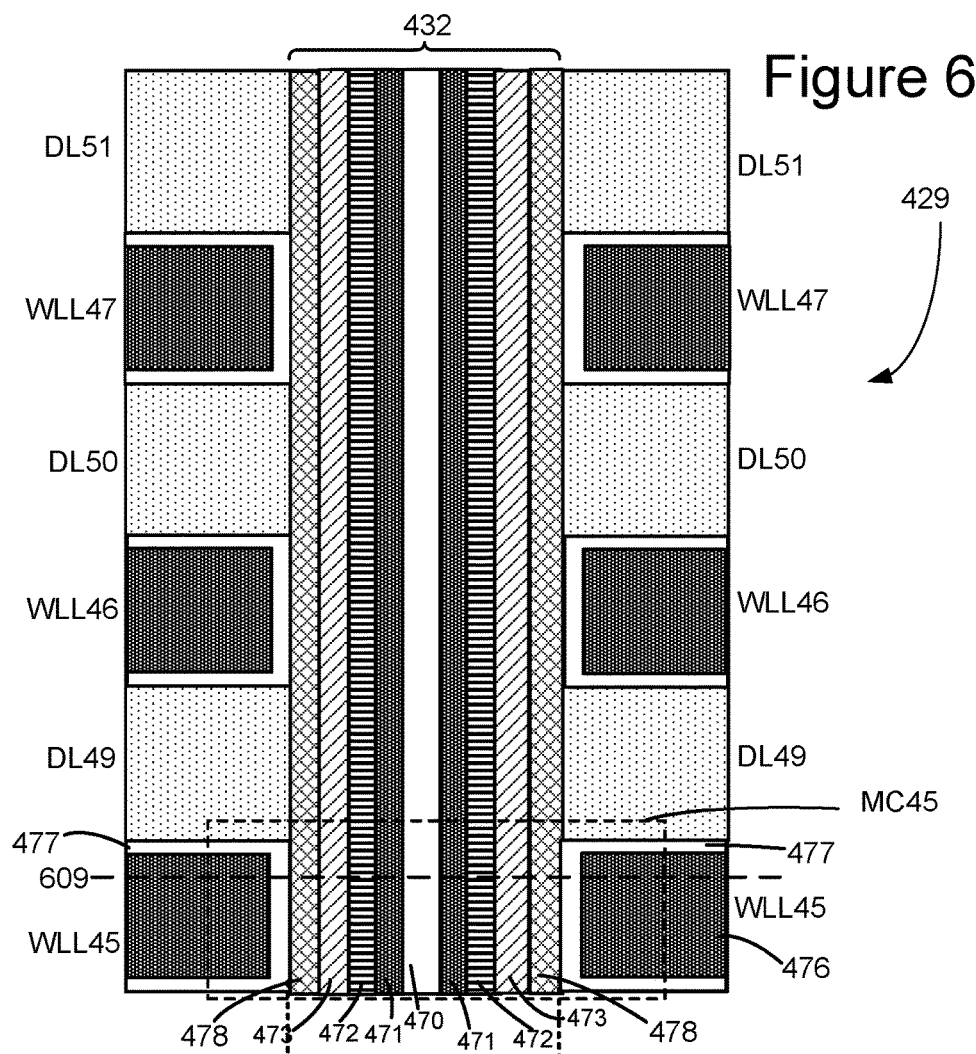
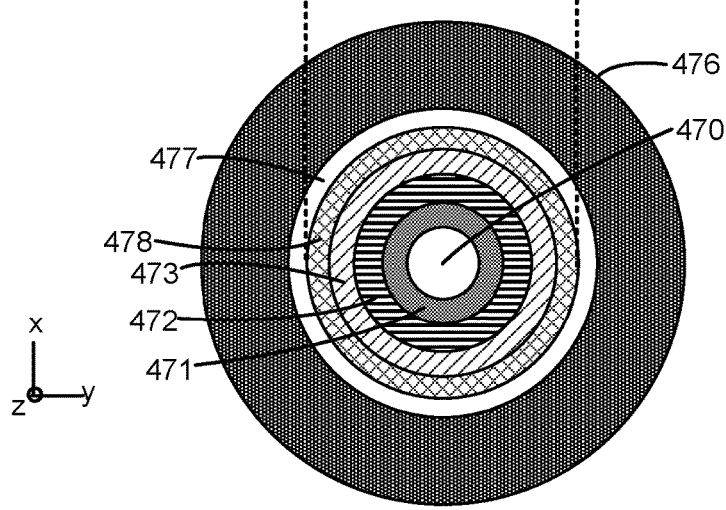
Figure 6A
FIG. 6B

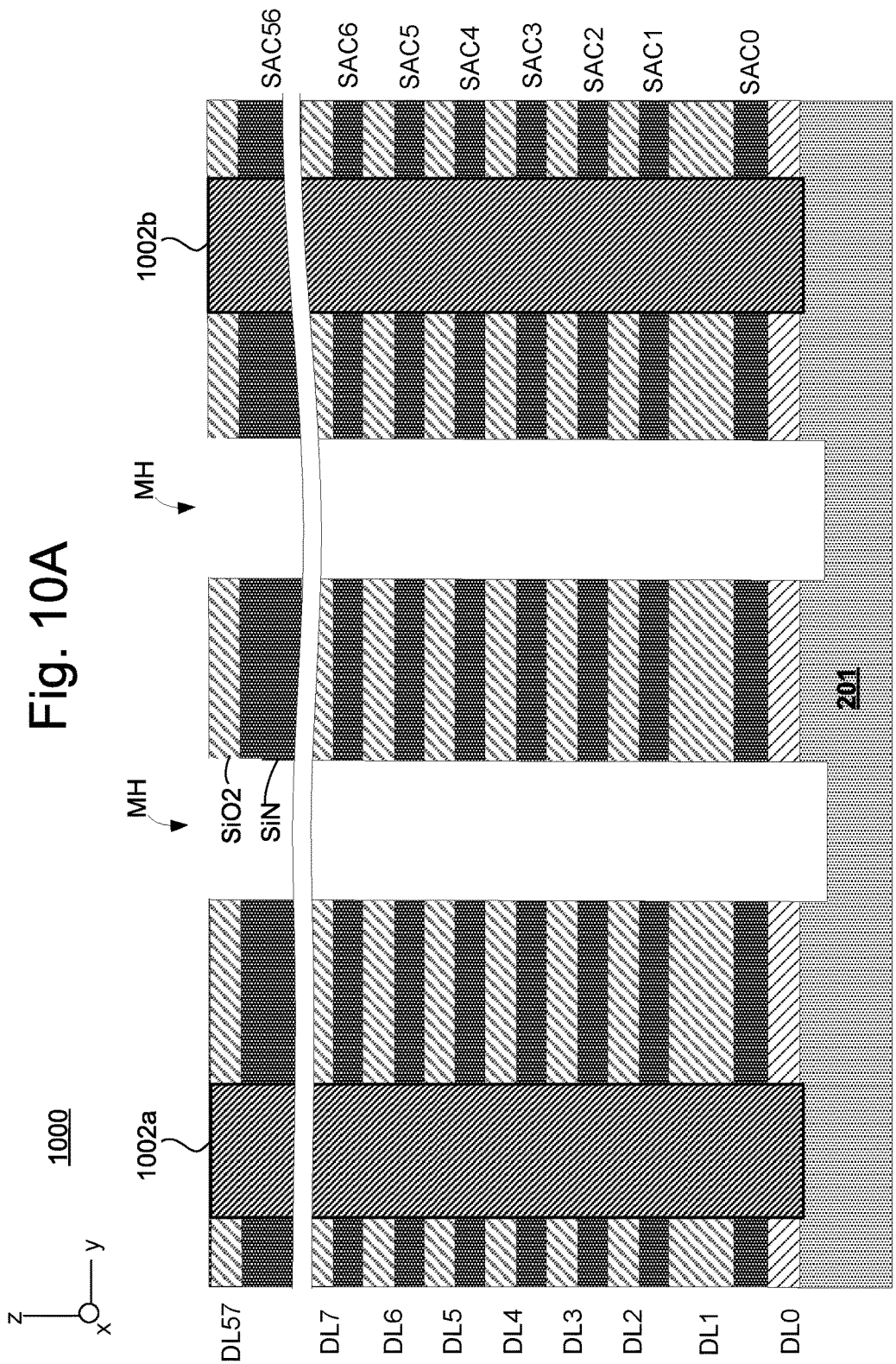

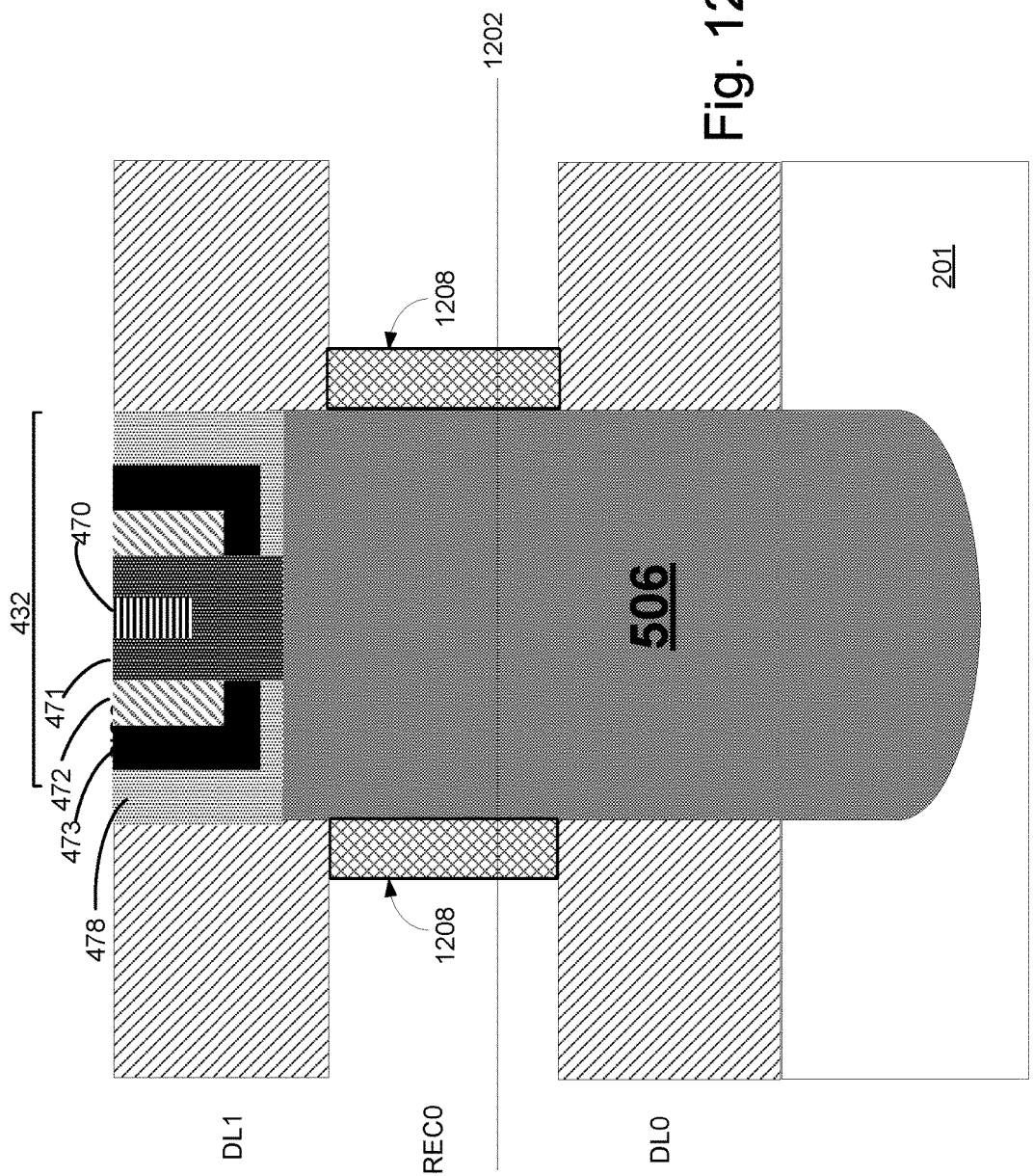

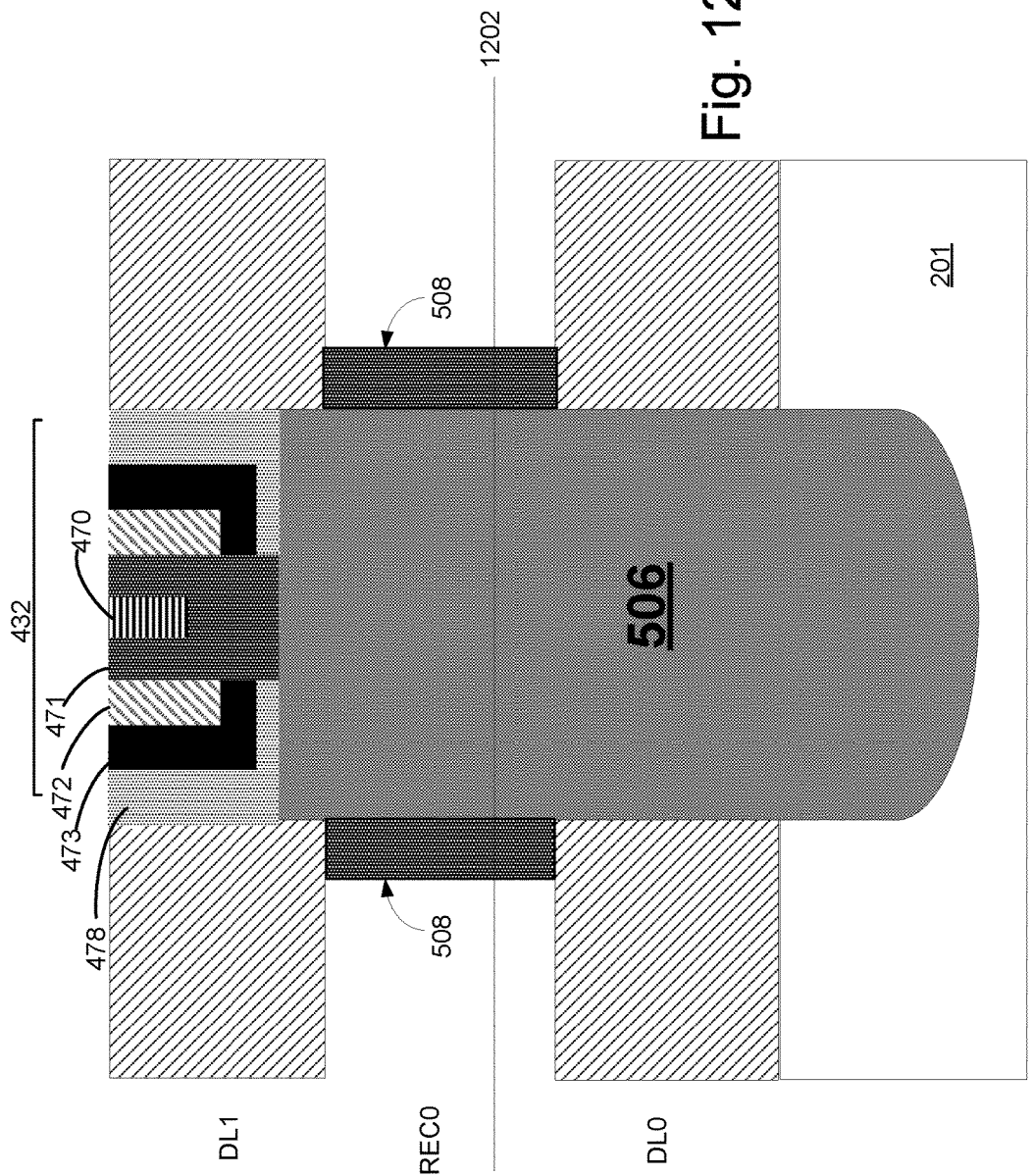

SELECT TRANSISTORS WITH TIGHT THRESHOLD VOLTAGE IN 3D MEMORY

CLAIM OF PRIORITY

This application is a divisional application of U.S. patent application Ser. No. 15/291,871, entitled "SELECT TRANSISTORS WITH TIGHT THRESHOLD VOLTAGE IN 3D MEMORY," by Pang et al., filed Oct. 12, 2016, published as US 2018/0102375 on Apr. 12, 2018 and issued as U.S. Pat. No. 9,941,293 on Apr. 10, 2018, incorporated herein by reference in its entirety.

BACKGROUND

The present technology relates to non-volatile memory.

Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. In one technique, a memory hole is drilled in the layers to define many memory layers simultaneously. A NAND string is then formed by filling the memory hole with appropriate materials. Control gates of the memory cells are provided by the conductor layers. Select gates are formed at either end of the memory hole.

BRIEF DESCRIPTION OF THE DRAWINGS

Like-numbered elements refer to common components in the different figures.

FIG. 2A is a circuit representation of one embodiment of a NAND string.

FIG. 2B is a circuit representation of one embodiment of a NAND string in which a select gate has a floating gate.

FIG. 4A is a block diagram explaining one example organization of memory structure.

FIG. 4C depicts a portion of an embodiment of three dimensional memory structure showing a cross-sectional view along line AA of FIG. 4B.

FIG. 5C depicts a close-up view of another embodiment of region 467 of FIG. 4C.

FIG. 5D depicts a cross-sectional view of the column 432 of FIG. 5C along line 519.

FIG. 6A depicts a cross sectional view of region 429 of FIG. 4C that includes a portion of vertical column 432.

FIG. 6B depicts a cross-sectional view of the column 432 of FIG. 6A along line 609.

FIGS. 10A-10K depict results after embodiments of various steps of process 900.

FIGS. 12A-12F depict results after embodiments of various steps of process 1100.

DETAILED DESCRIPTION

Figure 1A:
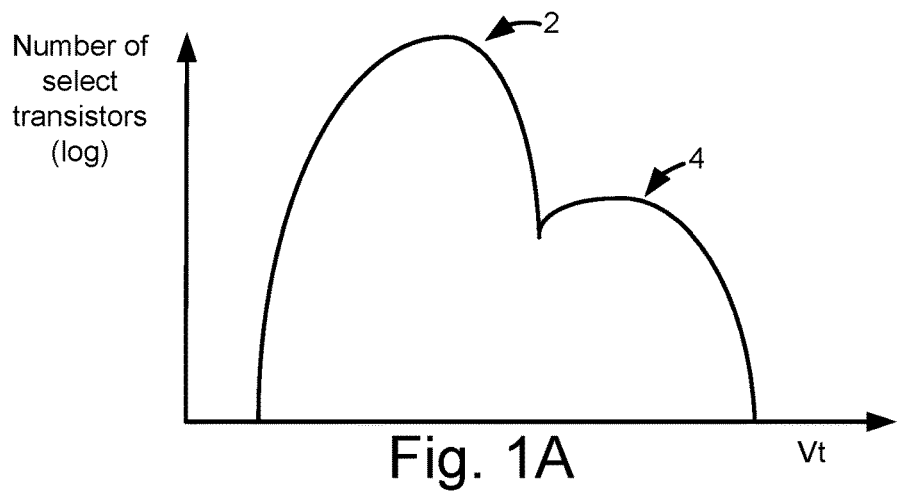
FIG. 1A shows a possible threshold voltage distribution of select transistors having a main lobe, and a hump lobe.

Disclosed herein is a 3D memory with a select transistor, and method for fabricating the same. The select transistor is a source side select transistor for vertically oriented NAND strings, in one embodiment. The threshold voltage of the source side select transistor can be impacted by variations in the 3D memory fabrication process. FIG. 1A shows a possible threshold voltage distribution of select transistors having a main lobe 2, and a hump lobe 4, to illustrate a possible problem. The main lobe 2 represents select transistors having a normal threshold voltage. The hump lobe 4 represents select transistors whose threshold voltage is higher than normal (or at least appears to be higher than normal).

Figure 1B:
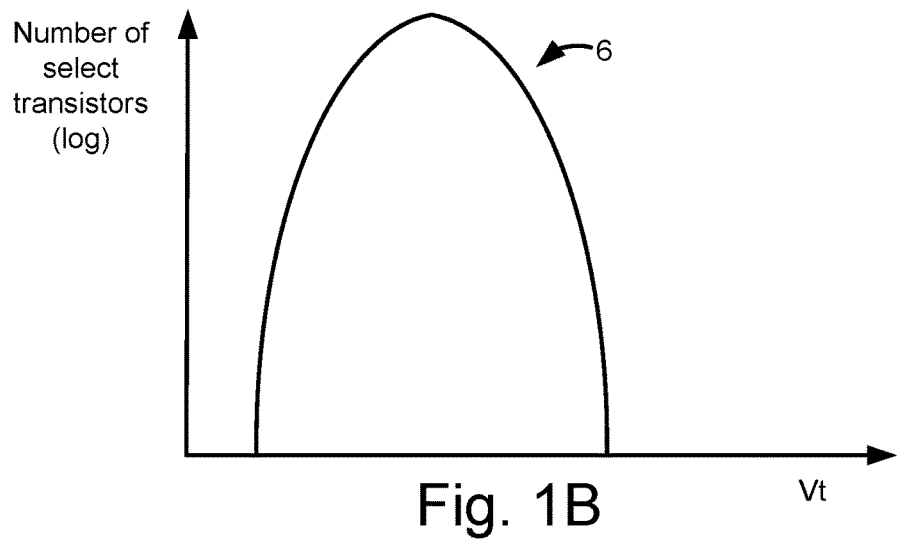
FIG. 1B shows a threshold voltage distribution of one embodiment of select transistors.

Embodiments disclosed herein include select transistors in 3D memory having a tight range of threshold voltages, and methods of forming the same. FIG. 1B shows a threshold voltage distribution of one embodiment of select transistors. The threshold voltage distribution 6 is more compact than the one in FIG. 1A. That is, the threshold voltage range is more narrow than the one in FIG. 1A. For example, there is not a hump lobe 4 in the threshold voltage distribution 6 in the embodiment of FIG. 1B. In other words, there is not a significant number of transistors having an abnormally high threshold voltage.

Figure 1C:
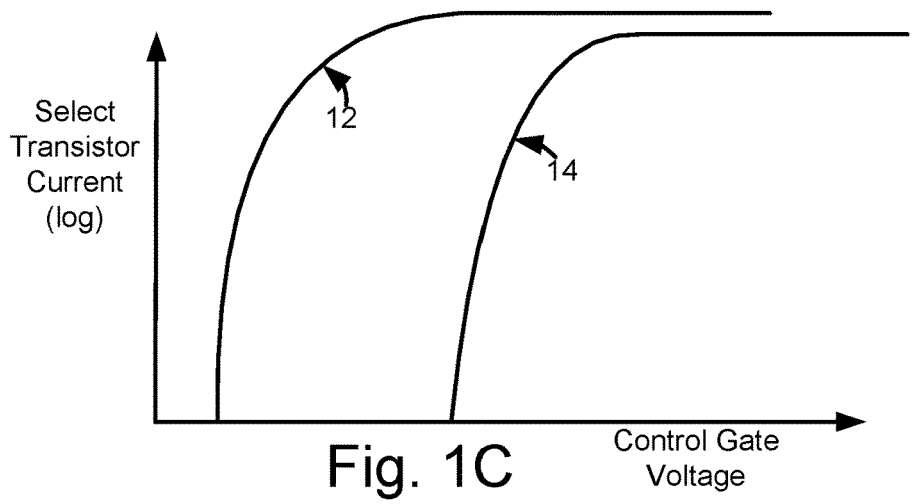
FIG. 1C depicts possible on current for select transistors to help illustrate a possible problem with select transistors in 3D memory.

The variance in threshold voltages may result in a variance in on current of the select transistors. FIG. 1C depicts possible on current for select transistors to help illustrate a possible problem with select transistors in 3D memory. Curve 12 is for a select transistor having a normal threshold voltage (corresponding to the main lobe 2 in FIG. 1A). Curve 14 is for a select transistor having an abnormally high threshold voltage (corresponding to the hump lobe 4 in FIG. 1A). This difference in on current of the select transistor can negatively impact memory cell operations such as erase, program, and read. Embodiments disclosed herein provide for select transistors in 3D memory, and methods of forming select transistors in a 3D memory, having good uniformity of on current. For example, the on current of a group of select transistors may be close to curve 12, without a significant number of select transistors having an on current similar to curve 14.

Figure 1D:
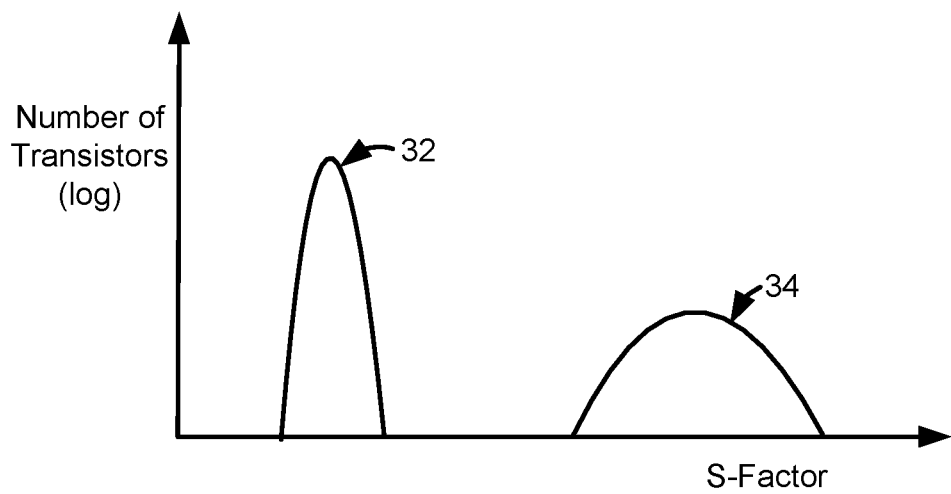
FIG. 1D shows possible curves for the subthreshold swing (S-factor) for select transistors to help illustrate a possible problem with select transistors in 3D memory.

Problems during fabrication can also result in variance of other parameters of select transistors. FIG. 1D shows possible curves for the subthreshold swing (S-factor) for select transistors to help illustrate a possible problem with select transistors in 3D memory. Curve 32 is a curve of the S-factor for the transistor with the normal threshold voltage. Curve 34 is a curve of the S-factor for the transistor with the abnormally high threshold voltage. The S-factor is the inverse of the subthreshold slope. A steep subthreshold slope exhibits a faster transition between off (low current) and on (high current) states, which may be desirable. Embodiments disclosed herein include select transistors in 3D memory, and methods of forming select transistors in a 3D memory, having good uniformity in S-factor. Embodiments disclosed herein include select transistors in 3D memory, and methods of forming select transistors in a 3D memory, having a steep subthreshold slope.

Figure 1E:
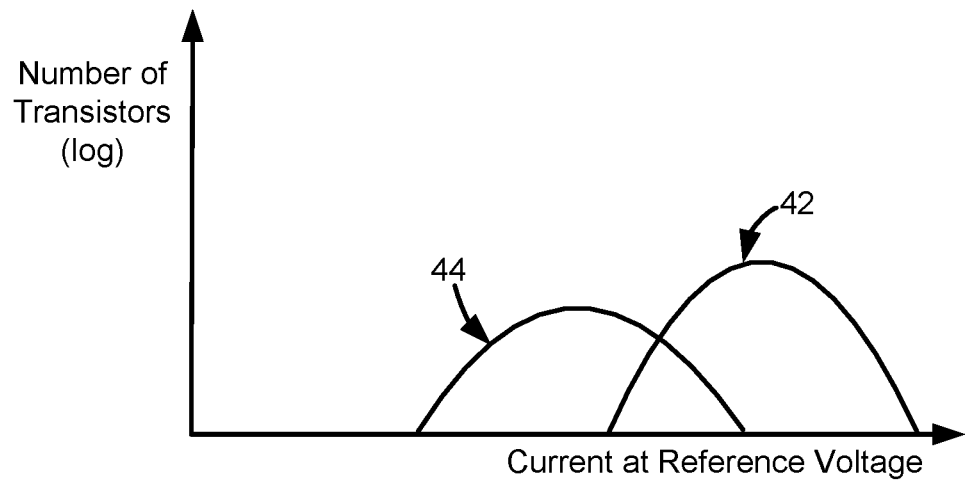
FIG. 1E shows possible curves for the select transistor on current at a reference voltage to help illustrate a possible problem with select transistors in 3D memory.

FIG. 1E shows possible curves for the select transistor on current at a reference voltage to help illustrate a possible problem with select transistors in 3D memory. The reference voltage might be near a voltage that is typically applied to the control gate of the select transistors during operation to place the select transistor into a conductive state. Curve 42 is a curve of the on current for the transistors with the normal threshold voltage 2 of FIG. 1A. Curve 44 is a curve of the on current for the transistors with the abnormally high threshold voltage 4 of FIG. 1A. It may be desirable to have a higher on current. Embodiments disclosed herein include select transistors in 3D memory, and methods of forming select transistors in a 3D memory, with a relatively high on current.

A possible reason why some of the select transistors may have an abnormally high threshold voltage (as well as the lower on current, and higher S-factor) is due to a leakage current between a control gate of the select transistor and a body of the select transistor. A leakage current between the control gate of the select transistor and a semiconductor substrate below the select transistor could also cause the aforementioned problems. The leakage current may be due, at least in part, to non-uniformities in thickness of a gate dielectric of the select transistor. For example, if the gate dielectric is significantly thinner than targeted, there could be current leakage when a voltage is applied to the control gate. The leakage current may be due, at least in part, to non-uniformities in thickness of a blocking oxide layer between the transistor control gate and body. The leakage current may be due, at least in part, to non-uniformities in thickness of a barrier layer between the control gate and body. Thus, a leakage current could occur due to various factors. The blocking oxide layer and barrier layer will be further discussed with respect to FIG. 5A. This current leakage may result in an increase in select transistor threshold voltage. Note that the increase in threshold voltage of the select transistor may be an apparent increase in threshold voltage, as a result of the leakage current. The current leakage could also manifest as a lower on current, as well as a lower S-factor.

One embodiment disclosed herein includes a method for fabricating a uniformly thick gate dielectric for the select transistor in 3D memory. This helps to prevent, or at least reduce, a leakage current between the select transistor control gate and the select transistor body. This may also help to prevent, or at least reduce, a leakage current between the select transistor control gate and the semiconductor substrate below the select transistor. Therefore, this embodiment provides for a group of select transistors having a substantially uniform threshold voltage, substantially uniform on current, as well as a substantially uniform S-factor. Also, this embodiment of select transistors may have a high on-current and a steep sub-threshold slope.

In one embodiment, a uniformly thick gate dielectric for the select transistor is formed as follows. Alternating layers of insulator material and sacrificial material are formed above a semiconductor substrate. An opening is formed through the alternating layers of the insulator material and the sacrificial material to the semiconductor substrate. A pillar of crystalline semiconductor is formed in a bottom of the opening in contact with the semiconductor substrate. This pillar may serve as the body of the select transistor. A layer of the sacrificial material is removed to form a recess that exposes a sidewall of the pillar of crystalline semiconductor. Crystalline semiconductor is formed in the recess on the sidewall of the pillar of crystalline semiconductor. The crystalline semiconductor that is formed in the recess is oxidized. This crystalline semiconductor may serve as a gate dielectric of the select transistor. A conductor is formed in the recess adjacent to the oxidized crystalline semiconductor. The conductor may serve as the control gate of the select transistor. A memory cell film is formed in the opening above the crystalline semiconductor. By oxidizing the crystalline semiconductor that is formed in the recess, the gate dielectric has good uniformity. This may prevent, or at least reduce, leakage current between the control gate and the body of the select transistor. This may also prevent, or at least reduce, leakage current between the control gate and the semiconductor substrate. Therefore, this embodiment provides for a group of select transistors having a substantially uniform threshold voltage, substantially uniform on current, as well as a substantially uniform S-factor. Also, this embodiment of select transistors may have a high on-current and a steep sub-threshold slope.

One embodiment includes an apparatus comprising a semiconductor substrate having a major surface, a select transistor, and a string of memory cells that extends vertically with respect to the major surface of the semiconductor substrate. The select transistor has a body formed from a solid pillar of semiconductor in contact with the semiconductor substrate. The select transistor also has a conductive floating gate, a conductive control gate, a first dielectric between the conductive floating gate and the conductive control gate, and a second dielectric between the body and the conductive floating gate. The string of memory cells has a string channel, wherein the body of the select transistor is in contact with the string channel. Likewise, the conductive floating gate may help to prevent, or at least reduce, leakage current between the control gate and the semiconductor substrate. The conductive floating gate may help to prevent, or at least reduce, leakage current between the control gate and the body of the select transistor. Therefore, this embodiment provides for a group of select transistors having a substantially uniform threshold voltage, substantially uniform on current, as well as a substantially uniform S-factor. Also, this embodiment of select transistors may have a high on-current and a steep sub-threshold slope.

As used herein, when an element, component or layer for example is described as being "on," "connected to," "coupled with," or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

A semiconductor region (e.g., substrate or film) may be roughly classified as crystalline or amorphous. An amorphous semiconductor region has disordered atomic arrangement and no crystalline component. An example is a semiconductor region in which no crystal part exists even in a microscopic region. Crystalline semiconductor regions include single-crystal and non-single-crystal semiconductor regions. A non-single crystal semiconductor region can be crystalline to a different degree. For instance, a poly-crystalline semiconductor region is comprised of "grains". Within each grain, the material is in the crystalline phase. That is, within each grain, the crystalline structure is oriented in the same way. However, in different grains, the crystal orientation may be different.

One example of a non-volatile storage system that can implement the technology described herein is a flash memory system that uses the NAND structure, which includes arranging multiple memory cell transistors in series, sandwiched between two select transistors. The memory cell transistors in series and the select transistors are referred to as a NAND string. FIG. 2A is a circuit representation of a NAND string. The NAND string depicted in FIG. 2A includes four memory cell transistors 100, 102, 104 and 106 in series and sandwiched between (drain side) select transistor 120 and (source side) select transistor 122. Select transistor 120 connects the NAND string to a bit line 111. Select transistor 122 connects the NAND string to source line 128. The source line 128 may contact the crystalline silicon substrate at a different locations from the select transistor 122.

Select transistor 120 is controlled by applying the appropriate voltages to select line SGD. The select line (SGD) is connected to a control gate terminal 120CG of the select transistor 120. Select transistor 122 is controlled by applying the appropriate voltages to select line SGS. The select line (SGS) is connected to a control gate terminal 122CG of the select transistor 122. Note that there may be more than one select transistor at each end of the NAND string, which work together as a switch to connect/disconnect the NAND string to and from the bit line and source line. For example, there may be multiple select transistors in series at each end of the NAND string.

Each of the memory cell transistors 100, 102, 104 and 106 has a control gate (CG) and a charge storage region (CSR). For example, memory cell transistor 100 has control gate 100CG charge storage region 100CSR. Memory cell transistor 102 includes control gate 102CG and a charge storage region 102CSR. Memory cell transistor 104 includes control gate 104CG and charge storage region 104CSR. Memory cell transistor 106 includes a control gate 106CG and a charge storage region 106CSR. Control gate 100CG is connected to word line WL3, control gate 102CG is connected to word line WL2, control gate 104CG is connected to word line WL1, and control gate 106CG is connected to word line WL0.

Note that although FIG. 2A shows four memory cells in the NAND string, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select transistor controlled by select line SGS and connected to its associated bit line by its drain select transistor controlled by select line SGD. Bit lines may be shared with multiple NAND strings. The bit line may be connected to a sense amplifier.

The charge storage region (CSR) may utilize a non-conductive dielectric material to store charge in a non-volatile manner. In one embodiment, a triple layer dielectric formed of oxide-nitride-oxide ("ONO") is sandwiched between a conductive control gate and the memory cell channel. As one example, the ONO is silicon oxide, silicon nitride and silicon oxide. As another example, the ONO may be $Al_2O_3$—SiN—$SiO_2$. In the direction from the control gate toward the NAND channel, the first oxide (e.g., $Al_2O_3$) forms at least a portion of a blocking layer, which blocks un-desirable tunneling of electrons from CSR to control gate or from control gate to CSR. The silicon nitride is a charge trapping layer or charge storage region (CSR), in one embodiment. The second oxide (e.g., $SiO_2$) is tunneling dielectric through which electron can tunnel from the channel to the CSR during programming. The blocking layer can be a stack of dielectrics, e.g. $Al_2O_3$—$SiO_2$ in the direction from control gate toward the NAND channel, in one embodiment. The tunneling layer can be a stack of different dielectric films, e.g. $SiO_2$—SiN—$SiO_2$, in one embodiment. The cell is programmed by injecting electrons from the cell channel (or NAND string channel) into the nitride, where they are trapped and stored in a limited region. This stored charge then changes the threshold voltage of the cell in a manner that is detectable. The cell may be erased by injecting holes into the nitride. Cells may be erased by injecting holes into the nitride where they recombine with electrons, and thereby "cancel" or reduce the stored charge. Cells may be also erased by extracting electrons from the nitride, e.g., by applying an electric field making electrons tunnel from nitride to the channel. Cells may be erased by both these mechanisms combined.

Numerous types of materials can be used for the charge storage regions (CSR). In one embodiment, the charge storage regions are conductive floating gates. As one example, the conductive floating gate is formed from polysilicon. This may be heavily doped polysilicon. Other types of non-volatile memory technologies can also be used.

FIG. 2B depicts one embodiment of a NAND string having a source side select transistor with a floating gate 518. The floating gate 518 may be formed from a variety of conductive materials including, but not limited to, polysilicon or metal. The polysilicon may be heavily doped to increase conductivity. The floating gate is separated from the body of the select transistor 122 by a gate dielectric. A dielectric may separate the floating gate 518 from the control gate 122CG. The select transistor may be controlled by applying a suitable voltage to the control gate 122CG. Note that the floating gate 518 is typically not used to store information as might be the case with a floating gate memory cell. The presence of the floating gate 518 can help achieve more uniform properties (e.g., threshold voltage, on current, S-factor) in source side select transistors in 3D memory. The presence of the floating gate 518 can help achieve a stronger on current, as well as a lower S-factor, in source side select transistors in 3D memory.

Figure 2C:
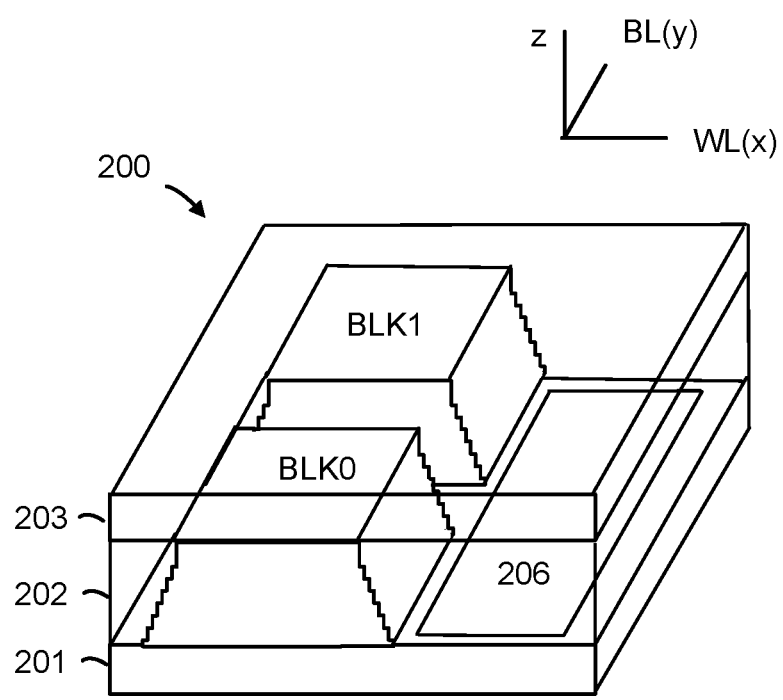
FIG. 2C is a perspective view of a 3D stacked non-volatile memory device.

FIG. 2C is a perspective view of a 3D stacked non-volatile memory device. The 3D memory device 200 includes a substrate 201. In one embodiment, the substrate 201 is formed from silicon. Thus, the substrate 201 may be a semiconductor substrate. In some embodiments, the substrate 201 is crystalline silicon. In some embodiments, the substrate 201 is single crystal silicon. The substrate 201 may be a semiconductor wafer. The substrate 201 has a major surface that extends in the x-y plane. On the substrate are example blocks BLK0 and BLK1 of memory cells and a peripheral area 206 with circuitry for use by the blocks. The substrate 201 can also carry circuitry under the blocks, along with one or more lower metal layers which are patterned in conductive paths to carry signals of the circuitry. The blocks are formed in an intermediate region 202 of the memory device. The circuitry associated with operation of the memory cells may be above or within the substrate 201. In one embodiment, the non-volatile memory device is monolithically formed in one or more physical levels of arrays of memory cells having an active area disposed above the substrate 201.

In an upper region 203 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. An x-y-z coordinate system is depicted, showing a y-direction (or bit line (BL) direction), an x-direction (or word line (WL) direction), as well as a z-direction. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 3:
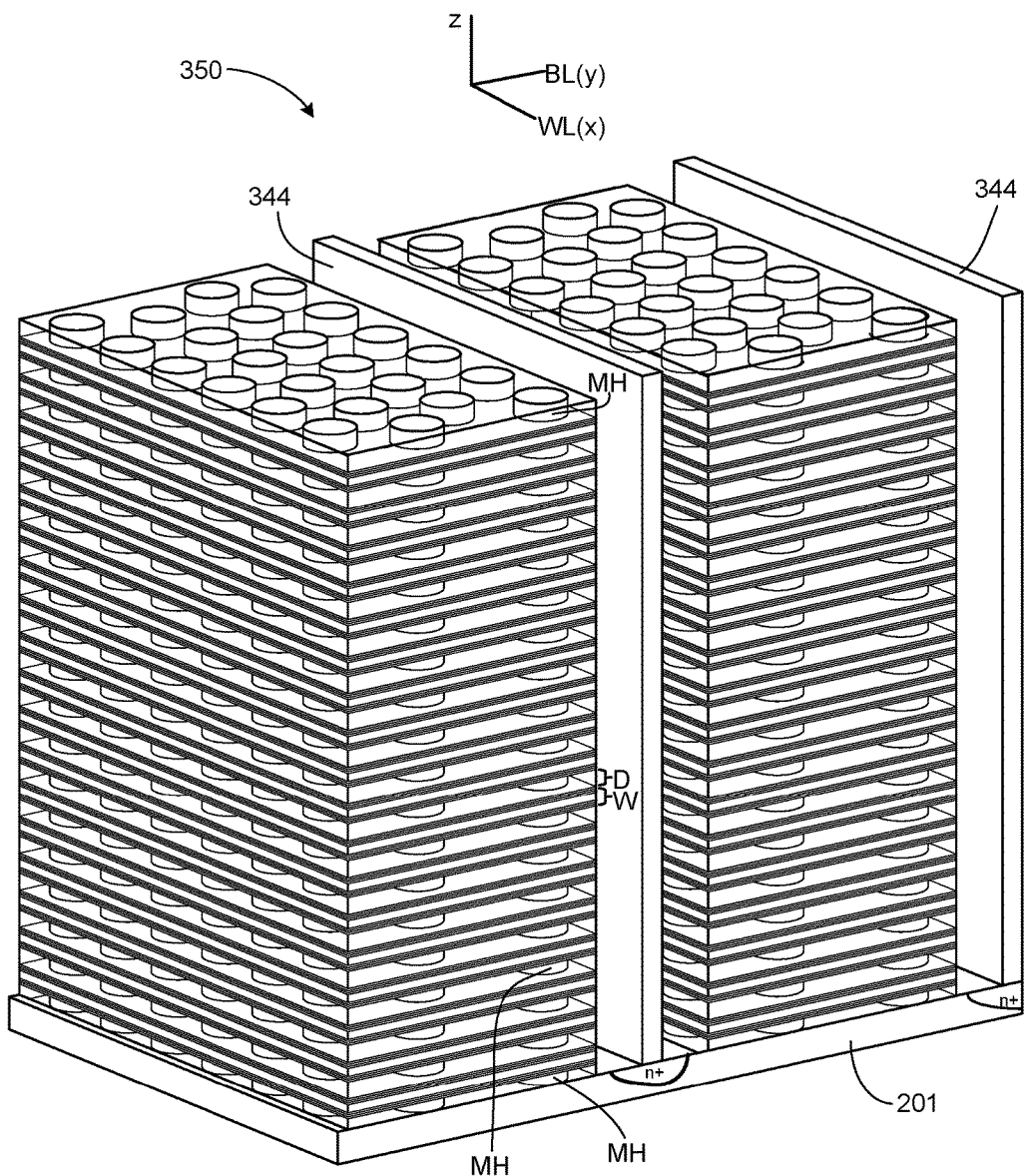
FIG. 3 is a perspective view of a portion of a three dimensional monolithic memory structure.

FIG. 3 is a perspective view of a portion of a three dimensional monolithic memory structure 350, which includes a plurality memory cells. For example, FIG. 3 shows a portion of one block of memory. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or fewer than 108-216 layers can also be used. The alternating dielectric layers and conductive layers are divided into "fingers" by local source lines 344. Note that the local source lines 344 may also be referred to as local interconnects LI. FIG. 3 only shows two fingers and two local interconnects LI. The local source lines 344 are conductive elements. Below and the alternating dielectric layers and word line layers is a substrate 201. Each local source line 344 is in electrical contact with an n+ diffusion region of the substrate 201, in one embodiment. Note that the local source lines 344 each have a major plane that extends in the x-z plane. In some embodiments, substrate 201 is single crystal silicon.

Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

The end of the MH that is connected to the substrate 201 is used for the body of the source side select transistor, in some embodiments. The source side select transistor may be used to connect/disconnect the string of memory cells to/from the local source lines 344.

FIG. 4A is a block diagram explaining one example organization of memory structure 350, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . .

Figure 4B:
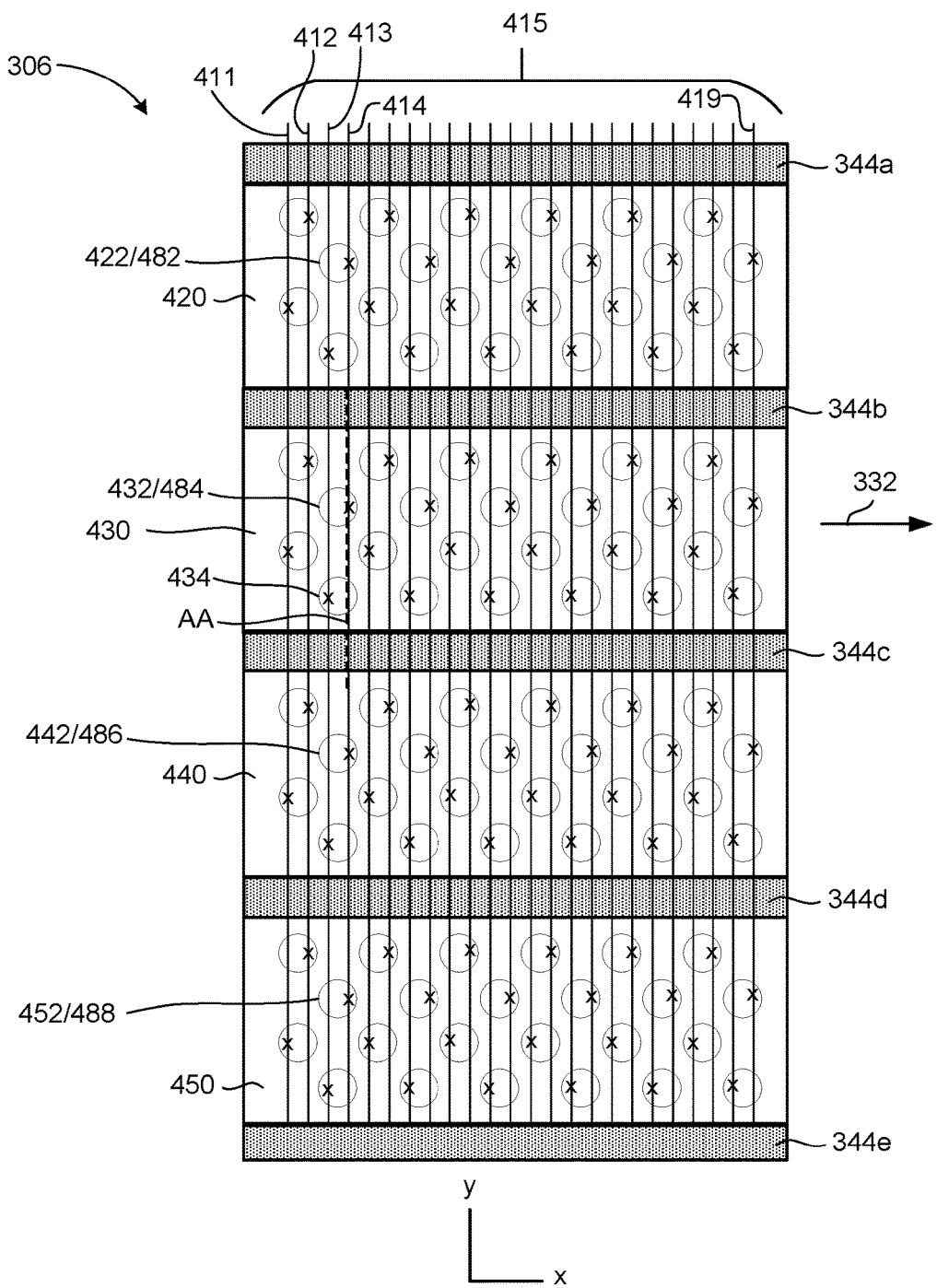
FIG. 4B depicts a plurality of circles that represent the vertical columns.

FIGS. 4B-4C depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in direction of 332. In one embodiment, the memory array will have 60 layers. Other embodiments have fewer than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local source lines 344a, 344b, 344c, 344d, 344e. Local source lines may also be referred to as "local interconnects". Local interconnects 344 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 4B also shows the vertical columns being staggered. In other embodiments, different patterns of staggering can be used. In some embodiments, the vertical columns are not staggered.

FIG. 4C depicts a portion of an embodiment of three dimensional memory structure 350 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; one source side select layer SGS; four dummy word line layers DWLL1*a*, DWLL1*b*, DWLL2*a* and DWLL2*b*; and forty eight data word line layers WLL0-WLL47 for connecting to data memory cells. Other embodiments can implement more or fewer than four drain side select layers, more than one source side select layer, more or fewer than four dummy word line layers, and more or fewer than forty eight word line layers (e.g., 96 word line layers). Vertical columns 432 and 434 are depicted protruding through the drain side select layers, source side select layer, dummy word line layers and word line layers. In one embodiment, each vertical column comprises a NAND string. For example, vertical column 432 comprises NAND string 484. Below the vertical columns and the layers listed below is semiconductor substrate 201. The substrate 201 is single crystal silicon, in some embodiments. The local source lines 344*b*, 344*c* are in direct electrical contact with an n+ region of the substrate 201, in this embodiment. The NAND string of vertical column 432 has a source end at a bottom of the stack and a drain end at a top of the stack. As in agreement with FIG. 4B, FIG. 4C show vertical column 432 connected to Bit Line 414 via bit line contact 418.

For ease of reference, drain side select layers SGD0, SGD1, SGD2 and SGD3; source side select layer SGS; dummy word line layers DWLL1*a*, DWLL1*b*, DWLL2*a* and DWLL2*b*; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Alternating with the conductive layers are dielectric layers DL0-DL57. For example, dielectric layer DL50 is above word line layer WLL46 and below word line layer WLL47. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1*a*, DWLL1*b*, DWLL2*a* and DWLL2*b* connect to dummy memory cells. A dummy memory cell does not store user data, while a data memory cell is eligible to store user data. However, structurally dummy and data memory cells are the same, in some embodiments. Drain side select layers SGD0, SGD1, SGD2 and SGD3 are used to electrically connect and disconnect NAND strings from bit lines. Source side select layer SGS is used to electrically connect and disconnect NAND strings from the source lines 344*b*, 344*c*.

Figure 5A:
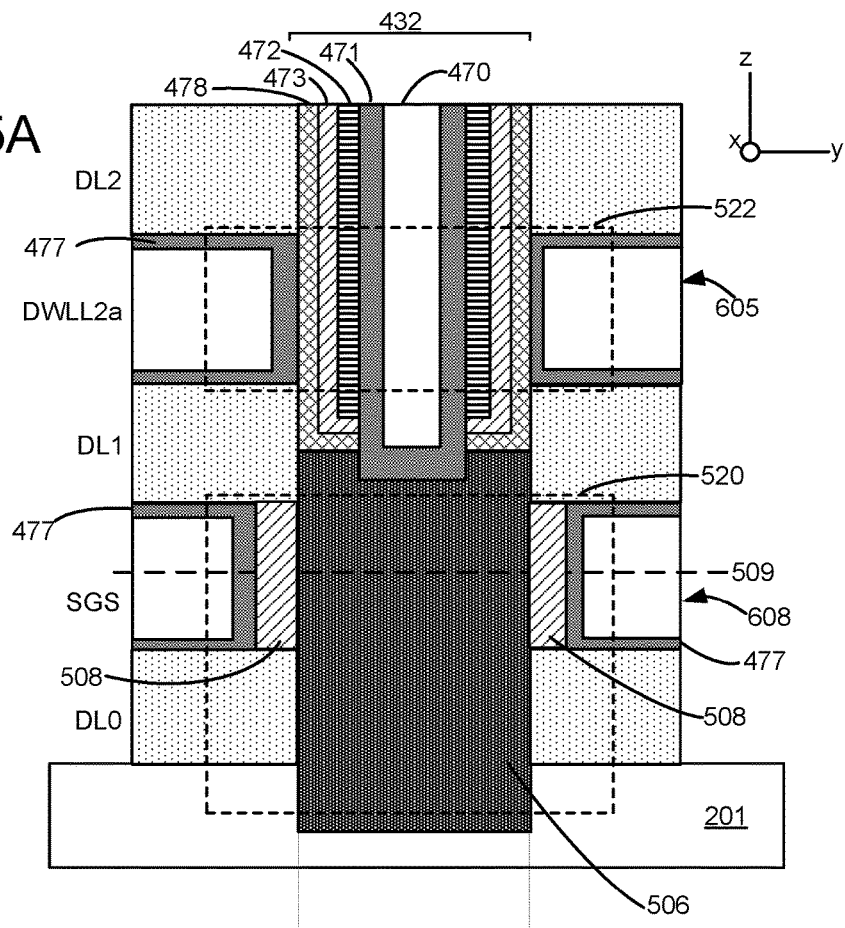
FIG. 5A depicts a close-up view of one embodiment of region 467 of FIG. 4C.

A region 467 of NAND string 484 is highlighted. FIG. 5A shows a close up view of one embodiment of region 467. FIG. 5C shows a close up view of another embodiment of region 467. A region 429 of NAND string 484 is highlighted. FIG. 6A shows a close up view of one embodiment of region 429.

Figure 5B:
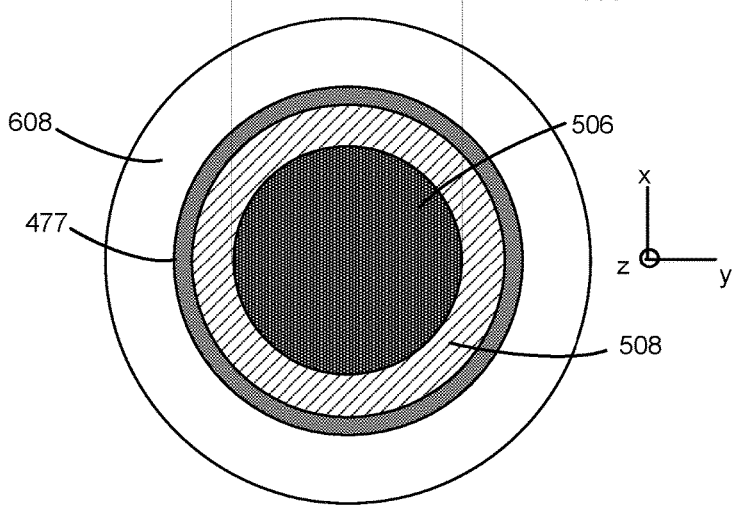
FIG. 5B depicts a cross-sectional view of the column 432 of FIG. 5A along line 509.

FIG. 5A depicts a close-up view of one embodiment of region 467 of FIG. 4C, which includes column 432 of FIG. 4C, showing a portion of source-side select transistor 520 and a dummy memory cell 522. FIG. 5B depicts a cross-sectional view of the column 432 of FIG. 5A along line 509. The embodiment of FIGS. 5A/5B is consistent with the embodiment of FIG. 2A.

The region 467 shows portions of the dielectric layers DL0 to DL2 and the conductive layers SGS and DWLL2*a*. In one embodiment, vertical column 432 includes an inner core layer 470 that is made of a dielectric, such as $SiO_2$. Other materials can also be used. Surrounding inner core 470 is semiconductor channel 471. Surrounding semiconductor channel 471 is a tunneling dielectric 472. The channel 471 comprises a semiconductor including, but not limited to, silicon (e.g., polysilicon).

In one embodiment, tunneling dielectric 472 has an ONO structure. Surrounding tunneling dielectric 472 is charge trapping layer 473, such as (for example) Silicon Nitride. Other memory materials and structures can also be used. Surrounding charge trapping layer 473 is blocking layer 478. Blocking layer 478 comprise a layer of $SiO_2$, in one embodiment. Region 477 also serves as a blocking layer. Note that region 477 is outside of the memory hole, but could alternatively be inside of the memory hole adjacent to (e.g., surrounding) layer 478. Region 477 is a layer of $Al_2O_3$, in one embodiment. Layers 471, 472, 473, and 478 may be referred to as memory cell films. Note that memory cell film region of vertical column 432 is consistent with FIG. 6B, in some embodiments.

Region 520 represents a portion of the source-side select transistor 520. The source-side select transistor 520 has a crystalline semiconductor body 506 in column 432, which extends partway into semiconductor substrate 201. The crystalline semiconductor body 506 is crystalline silicon, in one embodiment. The crystalline semiconductor body 506 is crystalline silicon germanium, in one embodiment. In some embodiments, the substrate 201 is a single crystal of silicon. In one embodiment, the body 506 is a solid pillar of epitaxial crystalline silicon. By epitaxial crystalline silicon it is meant that the crystalline silicon has the same crystalline orientation as the single crystal silicon substrate. In one embodiment, the crystalline silicon body is epitaxially grown on the single crystal silicon substrate. By a "solid" pillar it is meant that the pillar is not hollow and does not have a filler material in the interior.

A gate dielectric region 508 is depicted. The gate dielectric 508 is oxidized semiconductor, in one embodiment. The gate dielectric 508 formed by oxidizing single crystal semiconductor (e.g., single crystal silicon), in one embodiment. Thus, a high quality gate oxide may be formed. In one embodiment, the gate dielectric 508 is formed by lateral epitaxial growth, using the body 506 as a crystalline substrate to form a semiconductor in the recess. Then, the semiconductor in the recess may be oxidized to form a gate oxide. Alternately, the gate dielectric 508 may be formed by nitridation, or a combination of oxidation and nitridation. Thus, gate dielectric 508 may be oxide semiconductor, nitride semiconductor, or oxynitride semiconductor. For example, gate dielectric 508 may be silicon oxide, silicon nitride, or silicon oxynitride. Note that the gate dielectric 508 surrounds the body 506, in this embodiment. Also note that body 506 is aligned with the vertical column 432. Thus, gate dielectric 508 surrounds the portion of the vertical column 432 having the body 506. Further details are discussed below.

Conductive region 608 serves as a control gate for the source side select transistor 520. Region 477 and region 508 together serve as at least a portion of a gate dielectric for the source-side select transistor. For example, region 477 and region 508 may form a "vertical" gate dielectric. In one embodiment, region 477 is Al$_2$O$_3$. Note that conductive region 608 may surround region 477. Also note that there may be a thin barrier layer (e.g., titanium nitride) between the conductive region 608 and region 477. The barrier layer is not depicted in FIGS. 5A-5B. Also note that region 477 may surround the gate dielectric 508. Dielectric layer DL0 may serve as another portion of the gate dielectric of the source side select transistor 520. For example, dielectric layer DL0 may be a "horizontal" gate dielectric.

Note that it is possible for there to be non-uniformities in the thickness of the region 477. Also, in some embodiments, there is a barrier layer (e.g., titanium nitride) between control gate 608 and blocking layer 477. There may be non-uniformities in the thickness of such a barrier layer. The non-uniformities in thickness of either (or both) of these layers could potentially contribute to leakage current of the select transistor. One possible reason for the leakage current is that the electric field from the control gate 608 can be much stronger at the corner of the body 506 in close proximity to the substrate 201. This can result in leakage current (and/or breakdown) between the control gate 608 and substrate 201 and/or body 506. However, the presence of the gate oxide 508 can reduce or eliminate such leakage currents.

Also note that it is possible for the diameter of the body 506 to vary due to variations in the diameter of the memory hole. If a gate oxide were formed from the outer portion of the body 506, the thickness of the gate oxide could vary, which could result in leakage current. However, in the embodiment depicted in FIGS. 5A-5B, region 508 is not formed within the memory hole. Rather, it is formed outside of the memory hole. Thus, a more uniformly thick gate oxide can be formed, which can reduce or eliminate leakage current.

FIG. 5C depicts a close-up view of one embodiment of region 467 of FIG. 4C, which includes column 432 of FIG. 4C, showing a portion of source-side select transistor 520 and a dummy memory cell 522. FIG. 5D depicts a cross-sectional view of the column 432 of FIG. 5A along line 519. The embodiment of FIGS. 5C/5D is consistent with the embodiment of FIG. 2B, in which the source side select transistor has a floating gate 518. The region 467 shows portions of the dielectric layers DL0 to DL2 and the conductive layers SGS and DWLL2a. The vertical column 432 above (in z-direction) the source side select transistor may be similar to in the example of FIG. 5A. Note that the floating gate 518 surrounds the body 506, in this embodiment. Also note that body 506 is aligned with the vertical column 432. Thus, the floating gate 518 resides outside of the portion of vertical column 432 having the body 506.

Region 530 represents a portion of the source-side select transistor 530. The source-side select transistor 530 has a crystalline semiconductor body 506 in column 432, which extends partway into semiconductor substrate 201. The crystalline semiconductor body 506 is crystalline silicon, in one embodiment. The crystalline semiconductor body 506 is crystalline silicon germanium, in one embodiment. In some embodiments, the substrate 201 is a single crystal of silicon. In one embodiment, the body 506 is a solid pillar of epitaxial crystalline silicon. By a "solid" pillar it is meant that the pillar is not hollow and does not have a filler material in the interior. Region 516 is a gate dielectric. In one embodiment, this is a region 516 is an oxide semiconductor (e.g., silicon oxide). In one embodiment, this is a region 516 is a nitride semiconductor (e.g., silicon nitride). In one embodiment, this is a region 516 is an oxide-nitride semiconductor (e.g., silicon oxynitride).

The source side select transistor has a floating gate 518, in this embodiment. The floating gate 518 is formed from a conductive material, such as a heavily doped semiconductor or metal. Note that the floating gate 518 surrounds the gate dielectric 516, in this embodiment. Further details are discussed below.

Conductive region 608 serves as a control gate for the source side select transistor 520. Region 477 is a dielectric that separates the control gate 608 and the floating gate 518. Region 477 in this context may thus be referred to as an "inter-gate" dielectric. Region 477 may be a high-k dielectric. Herein, "high-k" dielectric means a material with a dielectric constant greater than SiO$_2$. In one embodiment, region 477 includes Al$_2$O$_3$. In one embodiment, region 477 includes ONO (silicon oxide/silicon nitride/silicon oxide). Note that conductive region 608 may surround region 477. Also note that region 477 may surround the floating gate 518.

Note that a portion of the channel of the source side select transistor may be in the substrate 201. Dielectric layer DL0 may serve as a gate dielectric between control gate 608 and substrate 201.

Similar to the example of FIGS. 5A-5B, there may be non-uniformities in the thickness of the region 477. Also, in some embodiments, there is a barrier layer (e.g., titanium nitride) between control gate 608 and blocking layer 477. There may be non-uniformities in the thickness of such a barrier layer. The non-uniformities in thickness of either (or both) of these layers could potentially contribute to leakage current of the select transistor 530. However, the presence of the floating gate 518 can reduce or eliminate such leakage currents.

Also note that it is possible for the diameter of the body 506 to vary due to variations in the diameter of the memory hole. Therefore, it is possible for the gate dielectric 516 to have some non-uniformities in thickness, which could result in leakage current. However, in the embodiment depicted in FIGS. 5C-5D, floating gate 518 can reduce or eliminate leakage current. Note that even if there is some variation in diameter of the body 506, the presence of floating gate 518 can help to prevent, or at least reduce, leakage current and/or breakdown of the select transistor 530.

FIG. 6A depicts a cross sectional view of region 429 of FIG. 4C that includes a portion of vertical column 432. FIG. 6B depicts a cross-sectional view of the column 432 of FIG. 6A along line 609. In one embodiment, the vertical columns are round in horizontal cross section and include four layers; however, in other embodiments more or fewer than four layers can be included and other shapes can be used. The layers 470, 471, 472, 472, 478 in the portion of the vertical column 432 depicted in FIG. 6A are similar to those at the dummy memory cell 522 in FIG. 5A. There may be some variance in the thickness of these layers between the top and bottom portion of the NAND string.

FIG. 6A depicts dielectric layers DL51, DL50, and DL49, as well as layers WLL45, WLL46, and WLL47. The word line layer WLL45 includes a word line region 476 surrounded by an aluminum oxide layer 477. The physical interaction of the word line layer with the vertical column forms a memory cell, MC45. Thus, a memory cell, in one embodiment, comprises semiconductor channel 471, tunneling dielectric 472, charge trapping layer 473, silicon oxide layer (e.g., $SiO_2$) 478, aluminum oxide layer 477 and word line region 476. Together, the aluminum oxide layer 477 and the silicon oxide layer may be referred to as a blocking layer. In other architectures, a memory cell may have a different structure; however, the memory cell would still be the storage unit. Note that the memory cells may form a part of a vertically oriented NAND string.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Although the example memory system discussed above is a three dimensional memory structure that includes vertical NAND strings with charge-trapping material, other memory structures can also be used with the technology described herein. For example, the charge trapping layer 473 can be replaced with a conductive layer. In this manner, floating gate memories can also be used.

The embodiment of FIGS. 6A and 6B may be used with either the embodiment of select transistor in FIGS. 5A/5B or the embodiment of select transistor in FIGS. 5C/5D, but is not limited to use with select transistors in those embodiments. Thus, the embodiment of FIGS. 6A/6B is consistent with the embodiment of FIG. 2A, as well as with the embodiment of FIG. 2B.

Figure 7A:
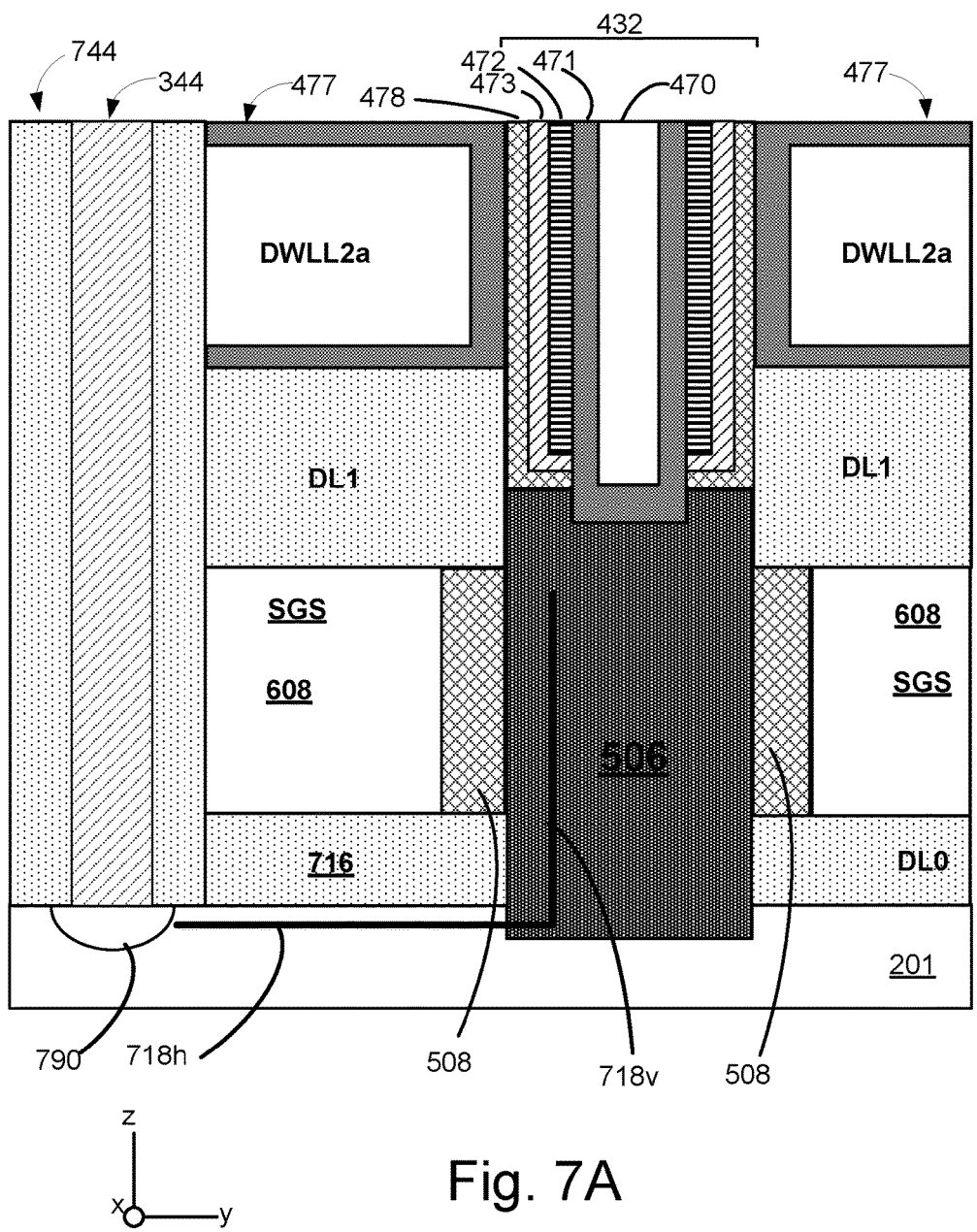
FIG. 7A shows electrical connections between of one embodiment the NAND strings and a bit line and a local source line.

FIG. 7A shows one embodiment a source side select transistor, showing how the source side select transistor may connect/disconnect a local source line 344 to/from a NAND string in 3D memory. The diagram is similar to the embodiment of FIG. 5A/5B, in which the source side select transistor has a gate dielectric 508 that is "outside" of the vertical column 432. FIG. 7A shows the bottom portion of column 432. The column 432 has silicon oxide region 478, charge storage region 473, tunnel dielectric 472, semiconductor channel 471, and core 470. Dielectric layers DL0 and DL0 are depicted. Conductive layers SGS and DWLL2a are also depicted.

FIG. 7A also depicts a source side select transistor. In general, the source side select transistor comprises body 506, gate dielectric 508, control gate 608, horizontal gate dielectric 716, source region 790. Conductive layer SGS serves as control gate 608, in this embodiment. A portion of the substrate 201 below horizontal gate dielectric 716 may be considered to form part of the body. In this embodiment, the body 506 is formed in the bottom portion of column 432. Optionally, region 477 could be present adjacent to SGS, as in FIG. 5A. In that option, region 477 forms a port of the "vertical" gate dielectric with gate dielectric 508.

Gate dielectric 508 is depicted on the body 506, but outside of the column 432. Gate dielectric 508 is formed using lateral epitaxial growth with body 506 serving as a crystalline substrate to form a semiconductor, in one embodiment. Then, the gate dielectric is formed from the epitaxially grown epitaxial semiconductor. The horizontal cross section along SGS may have concentric rings, similar to the embodiment of FIG. 5B. For example, body 506 may be a solid pillar, which is surrounded by gate dielectric 508, which is surrounded by control gate 608.

The channel 718 of the source side select transistor has a vertical component 718v in the body 506 and a horizontal component 718h in the substrate 201. A gate dielectric 716 is depicted on the surface of the substrate 201. This gate dielectric 716 may serve as a horizontal portion of the gate dielectric of the source side select transistor. The gate dielectric 716 could layer DL0.

Region 790 may act as a source region of the source side select transistor. Region 790 may be an n+ region. Thus, region 790 can be formed by heavily doping the semiconductor substrate 201. The n-type impurity can be phosphorous (P), arsenic (As) or a combination of both, for example.

The local source line 344 is in electrical contact with the region 790 of the source side select transistor. The local source line 344 is formed from metal, in one embodiment. Example metals include, but are not limited to, titanium, tungsten, copper, aluminum, and molybdenum. The local source line 344 is electrically insulated from the conductive layers (e.g., SGS, DWLL2a, etc.) by insulator 744. Insulator 744 could be, for example, silicon oxide. The local source line 344 can be electrically connected to the NAND string channel 471 by the action of the source side select transistor, when a respective bias is applied to the control gate 608. Note that the local source line 344 may serve as a common source line for a number of NAND strings.

Note that the body 506 is not necessarily the entire body region of the source side select transistor, as a portion of substrate 201 (e.g., near the horizontal portion of channel 718h could be considered to form a portion of the body region of the source side select transistor.

In some embodiments, there is a single SGS layer in which the source side select transistor is formed. However, more than one SGS layer may be used for the source side select transistor.

Figure 7B:
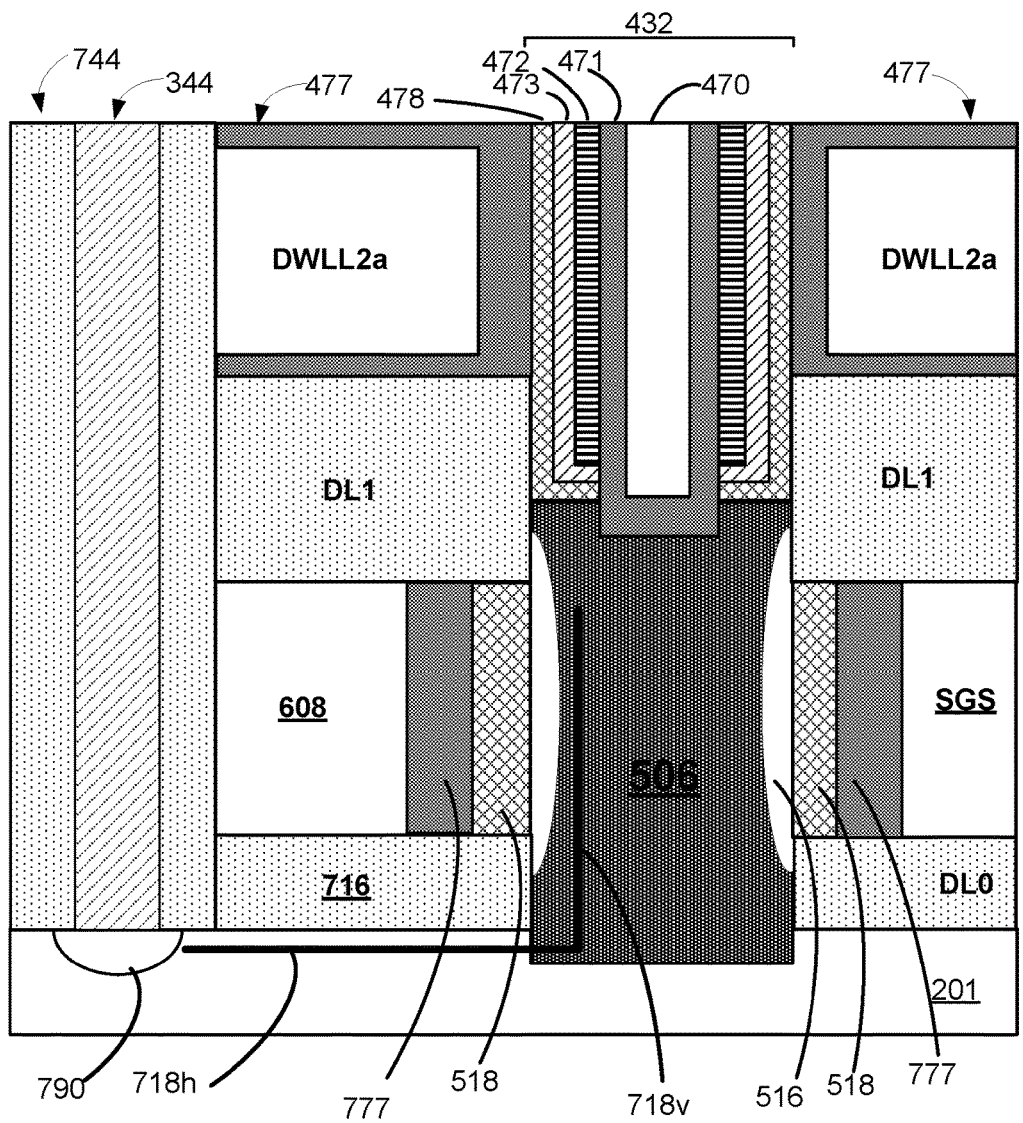
FIG. 7B shows electrical connections between of another embodiment the NAND strings and a bit line and a local source line.

FIG. 7B shows one embodiment a source side select transistor, showing how the source side select transistor may connect/disconnect a local source line 344 to/from a NAND string. The diagram is similar to the embodiment of FIG. 5C/5D, in which the source side select transistor has a floating gate 518. FIG. 7B shows the bottom portion of column 432. The column 432 has silicon oxide region 478, charge storage region 473, tunnel dielectric 472, semiconductor channel 471, and core 470. Dielectric layers DL0 and DL0 are depicted. Conductive layers SGS and DWLL2a are also depicted.

FIG. 7B also depicts a source side select transistor. In general, the source side select transistor comprises body 506, gate dielectric 516, floating gate 518, vertical gate dielectric 777, control gate 608, horizontal gate dielectric 716, and source region 790. Vertical gate dielectric 777 may also be referred to as an inter-gate dielectric. A portion of the substrate 201 below the horizontal gate dielectric 716 may be considered to form part of the body. In this embodiment, body 506 is formed in the bottom portion of column 432. Gate dielectric 516 is depicted on the body 506. Floating gate 518 is depicted adjacent to gate dielectric 516. Dielectric region 777 is depicted between floating gate 518 and control gate 608. Conductive layer SGS server as control gate 608, in this embodiment. Dielectric region 777 could include a variety of materials. In one embodiment, dielectric region 777 comprises Aluminum oxide. In one embodiment, dielectric region 777 comprises ONO.

The channel 718 of the source side select transistor has a vertical component 718v in the body 506 and a horizontal component 718h in the substrate 201. A horizontal gate dielectric 716 is depicted on the surface of the substrate 201. This horizontal gate dielectric 716 may serve as a portion of the gate dielectric of the source side select transistor. The gate dielectric 716 could layer DL0.

Region 790 may act as a source region of the source side select transistor. Region 790 may be an n+ region. Thus, region 790 can be formed by heavily doping the semiconductor substrate 201. The n-type impurity can be phosphorous (P), arsenic (As) or a combination of both, for example.

The local source line 344 is in electrical contact with the region 790 of the source side select transistor. The local source line 344 is formed from metal, in one embodiment. Example metals include, but are not limited to, titanium, tungsten, copper, aluminum, and molybdenum. The local source line 344 is electrically insulated from the conductive layers (e.g., SGS, DWLL2a, etc.) by insulator 744. Insulator 744 could be, for example, silicon oxide. The local source line 344 can be electrically connected to the NAND string channel 471 by the action of the source side select transistor, when a respective bias is applied to the control gate 608. Note that the local source line 344 may serve as a common source line for a number of NAND strings.

In some embodiments, there is a single SGS layer in which the source side select transistor is formed. However, more than one SGS layer may be used for the source side select transistor.

Figure 8:
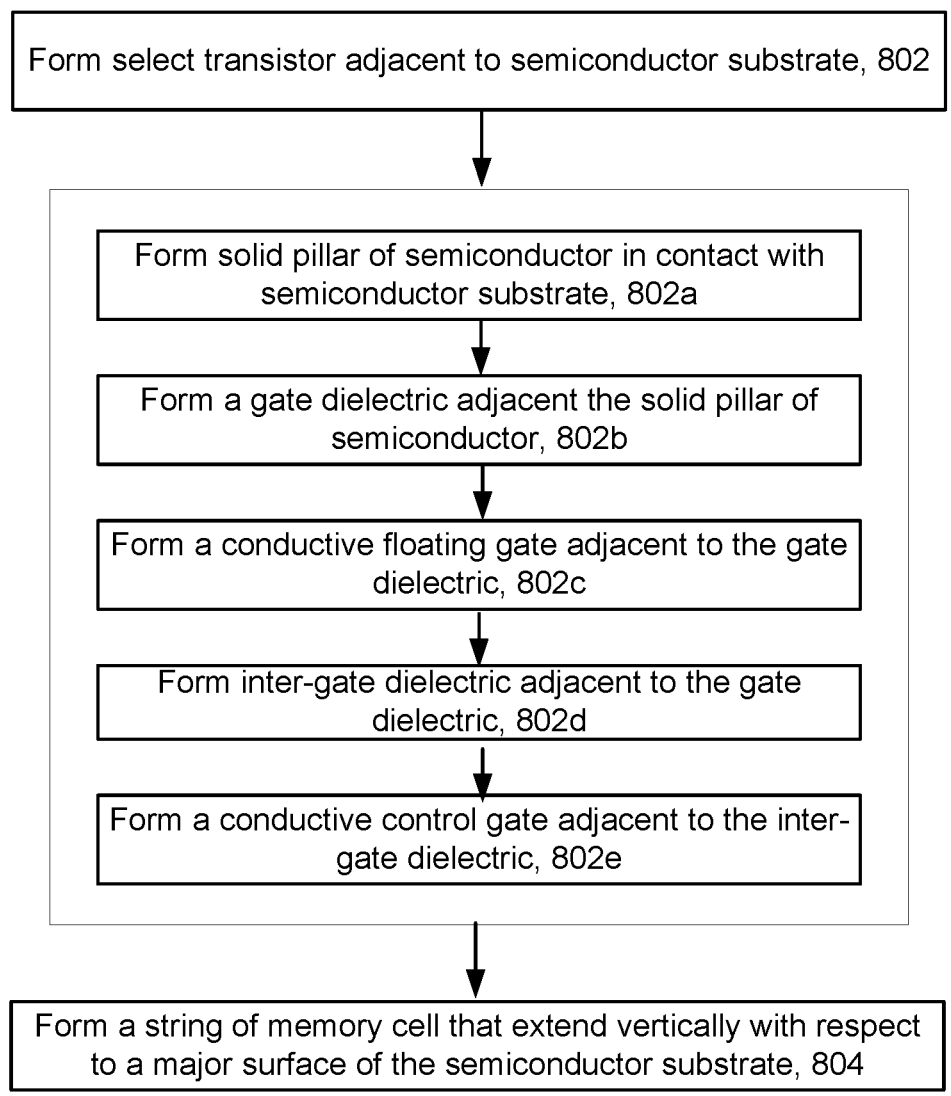
FIG. 8 is a flowchart of one embodiment of a process of fabricating a 3D memory array in which a select transistor has a floating gate.

FIG. 8 is a flowchart of one embodiment of a process 800 of fabricating a 3D memory array that has a select transistor having a floating gate. The floating gate may help to prevent or reduce current leakage during device operation. Also formed is a string of memory cells in the 3D memory array. The process 800 may be used to fabricate devices such as, but not limited to, those depicted in FIGS. 2B, 2C, 3, 4B, 4C, 5C, 5D, 6A, 6B, and 7B. Note that not all process steps are described. For example, some etching, cleaning, doping, and/or annealing steps may be omitted.

Step 802 includes forming a select transistor adjacent to a semiconductor substrate 201. The semiconductor substrate 201 is a crystalline semiconductor in some embodiments. The semiconductor substrate 201 may be a single crystal. The semiconductor substrate 201 may be silicon, but another semiconductor could be used.

Step 802 includes sub-steps 802a-802e. In step 802a, a solid pillar of semiconductor is formed in contact with the semiconductor substrate. This solid pillar is single crystal semiconductor, in some embodiments. The semiconductor may be silicon, but another semiconductor could be used. The solid pillar of semiconductor will serve as the body 506 of a source side select transistor in a 3D memory array. In some embodiments, step 802a includes epitaxially growing a crystalline semiconductor in contact with the semiconductor substrate.

Step 802b includes forming a gate dielectric adjacent to the solid pillar of semiconductor. In one embodiment, step 802c includes forming the gate dielectric from a portion of the solid pillar of semiconductor. For example, step 802b may include oxidizing epitaxially grown crystalline semiconductor to form the gate dielectric from oxidized crystalline semiconductor. Note that after the gate dielectric is formed from a portion of the solid pillar of semiconductor, the semiconductor is converted to a dielectric. As one example, gate dielectric 516 is formed (see, for example, FIGS. 5C and 5D).

Step 802c includes forming a conductive floating gate adjacent to the gate dielectric. The conductive floating gate might be formed from silicon, metal, etc. The silicon may be heavily doped to increase conductivity. As one example, conductive floating gate 518 is formed (see, for example, FIGS. 5C and 5D). Note that the conductive floating gate 518 surrounds the solid pillar of semiconductor, in some embodiments.

Step 802d includes forming an inter-gate dielectric adjacent to the conductive floating gate. In one embodiment, step 802c includes forming the inter-gate dielectric from ONO. In one embodiment, step 802c includes forming the inter-gate dielectric from aluminum oxide. The inter-gate dielectric is formed from a high-k dielectric, in some embodiments. As one example, region 477 is formed (see, for example, FIGS. 5C and 5D). As another example inter-gate dielectric 777 is formed (see, for example, FIG. 7B).

Step 802e includes forming a conductive control gate adjacent to the inter-gate dielectric. The conductive control gate might be formed from silicon, metal, etc. The silicon may be heavily doped to increase conductivity. As one example, conductive control gate 608 is formed (see, for example, FIGS. 5C and 5D).

In step 804, a string of memory cells is formed that extend vertically with respect to a major surface of the semiconductor substrate 201. Step 804 may include forming a channel 471 of the string in contact with the solid pillar of semiconductor of the select transistor. The string may be a NAND string, such as depicted in FIG. 2B, 3, 6B.

Figure 9:
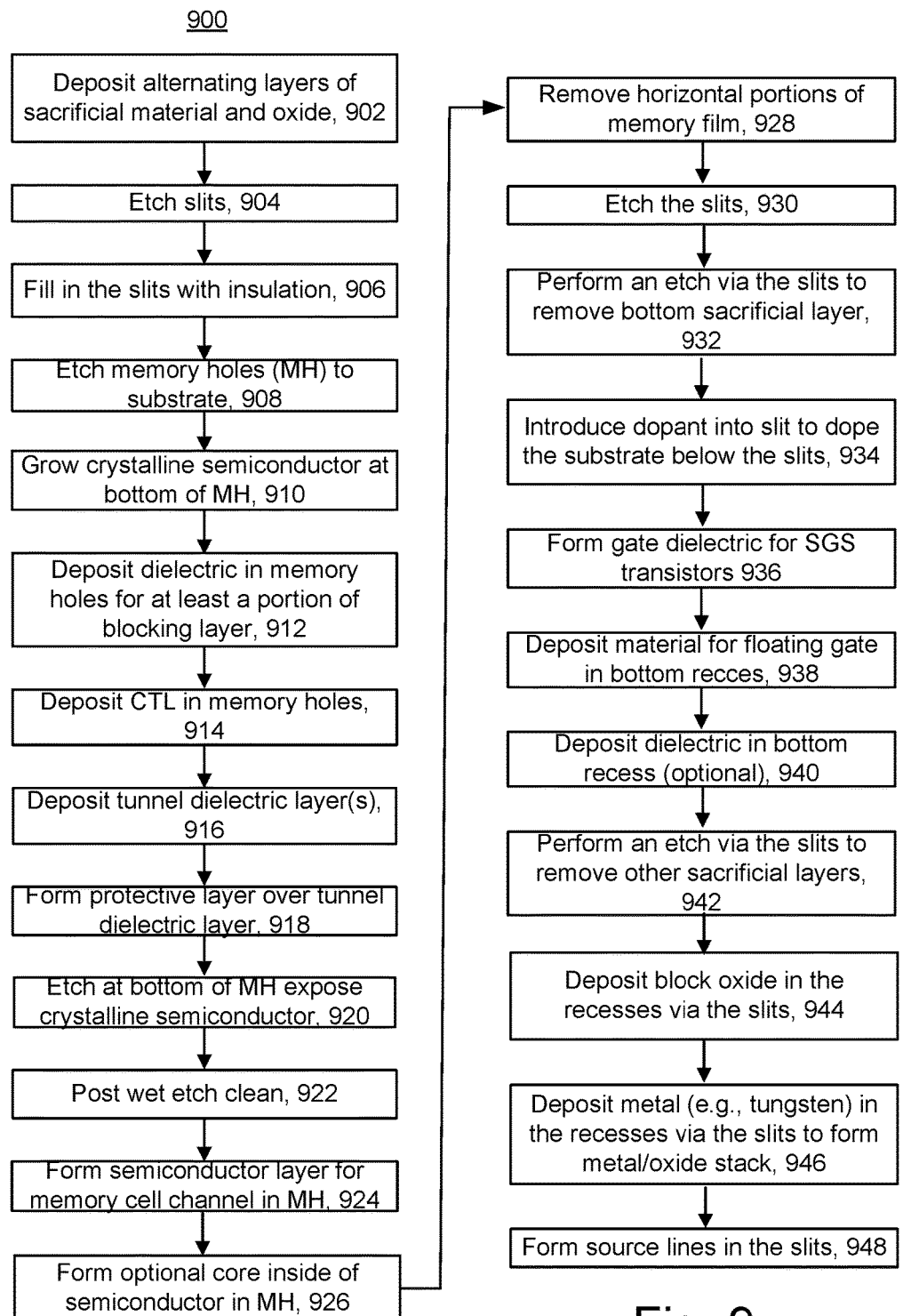
FIG. 9 is a flowchart of one embodiment of a process of fabricating a 3D memory array in which a select transistor has a floating gate.

FIG. 9 is a flowchart of one embodiment of a process 900 of fabricating a 3D memory array. Process 900 is used to form a select transistor having a floating gate. Also formed is a string of memory cells in a 3D memory array. Process 900 is one embodiment of process 800. The process 900 may be used to fabricate devices such as, but not limited to, those depicted in FIGS. 2B, 2C, 3, 4B, 4C, 5C, 5D, 6A, 6B, and 7B. Note that not all process steps are described. For example, some etching, cleaning, doping, and/or annealing steps may be omitted. FIGS. 10A-10K depict results after embodiments of various steps of process 900.

Step 902 includes a stack of alternating layers of oxide and sacrificial material above a semiconductor substrate 201. The lowest layer of sacrificial material is amorphous silicon and the other layers of sacrificial material are silicon nitride, in one embodiment. All layers of sacrificial material are silicon nitride, in one embodiment. However, the lowest sacrificial layer of silicon nitride may be processed in a manner such that it etches faster than the other sacrificial layers of silicon nitride during step 932. In some embodiments, depositing the sacrificial silicon nitride layers uses the precursor hexacholorosilane (Si2Cl6) with ammonia (NH3). In one embodiment, the lowest sacrificial silicon nitride has a higher wet etch rate than the other sacrificial layers of silicon nitride. The wet etch rate of the silicon nitride can be altered by hydrogen content. For example, the hydrogen content in the lowest sacrificial silicon nitride is at least 5% higher than the hydrogen content in the other sacrificial layers of silicon nitride, in one embodiment. The desired hydrogen content can be achieved by a silicon nitride deposition process using precursor hexacholorosilane (Si2Cl6) with ammonia (NH3), as one example.

The silicon oxide layers could be the dielectric of dielectric layers DL0-D57 in FIG. 4C. However, rather than depositing the conductive layers (e.g., SGS, DWLL2a, DWLL2b, WL0-WL47, DWLL1b, DWLL1a, SGD3-SGD0) the sacrificial material may be deposited instead. The substrate may be single crystal silicon. The crystalline silicon substrate may have a major plane that extends in a horizontal direction. The major plane may extend in the x/y-plane, as depicted in FIGS. 2C, 3, 4C, 5C, and 7B, for example. The layers of material may extend in the horizontal direction with respect to the major plane of the substrate.

Step 904 includes etching slits in the alternating layers of oxide and sacrificial material. Step 906 includes filling in the slits with insulation. Note that later in the process at least a portion of this insulation will be removed. Note that such slits could extend for the entire length of a block.

Step 908 includes etching memory holes through the stack of alternating layers of the oxide and sacrificial material. Note that string select transistors (both source and drain side) may be formed in the memory holes. Note that many such memory holes can be formed in the stack of alternating layers. A memory hole could correspond to any of the columns that are depicted in FIG. 4B-4C, 5C-5D, or 6A-6B, for example. A memory hole may extend vertically through the stack of alternating layers of the oxide and sacrificial material down to the crystalline semiconductor substrate 201, as one example. The memory holes may extend partway into the crystalline semiconductor substrate 201.

Reactive ion etching can be used to etch the memory holes. In the memory array area, the memory holes are placed densely. For example, the memory holes can have a diameter of 70-110 nanometers (nm) (70-110×10$^{-9}$ meters). This is an example range; other ranges could be used. Also note that the diameter could vary from top to bottom.

FIG. 10A shows results after one embodiment of step 908. FIG. 10A shows sacrificial layers (SAC0-SAC6 and SAC 56) alternating with insulating layers (DL0-DL7 and DL57) in a stack 1000 over a crystalline semiconductor substrate 201. As noted above, there may be more or fewer layers than in this example. Sacrificial layers SAC7 through SAC55 are not depicted in FIG. 10A. Insulating layers DL8 through DL56 are not depicted in FIG. 10A. FIG. 10A is consistent with formation of the device of FIG. 4C, which shows two memory holes 432, 434, and two source lines 344b, 344c. The two vertical memory holes (MR) in FIG. 10A correspond to memory holes 432, 434. In FIG. 10A, regions 1002a, 1002b are where insulation has been used to fill the slits. The source lines 344b, 344c will eventually be formed in regions 1002a, 1002b.

The sacrificial layers will eventually be layers SGS, DWLL2a, DWWL2b, WLL0-WLL47, DWLL1b, DWWL2a, SGD3, SGD2, SGD1, and SGD0 (note that the aluminum oxide layer 477 may also be formed in the region vacated by the sacrificial layers in one embodiment). Sacrificial layer SAC0 is amorphous silicon and sacrificial layers SAC1-SAC56 are silicon nitride, in one embodiment. Sacrificial layers SAC0-SAC56 are silicon nitride with layer SAC0 processed in a manner that it will etch faster than layers SAC1-SAC56 in step 932, in one embodiment.

The insulating layers are silicon oxide in this embodiment. The two memory holes (MR) are depicted as extending vertically through the alternating sacrificial layers and insulating layers. The memory holes extend down into the semiconductor substrate 201. Etching the memory holes could etch partway into the semiconductor substrate 201, as depicted in FIG. 10A. An x-y-z coordinate system is depicted, showing the direction of formation. The memory holes each have a major axis that is parallel to the z-axis.

Figure 10B:
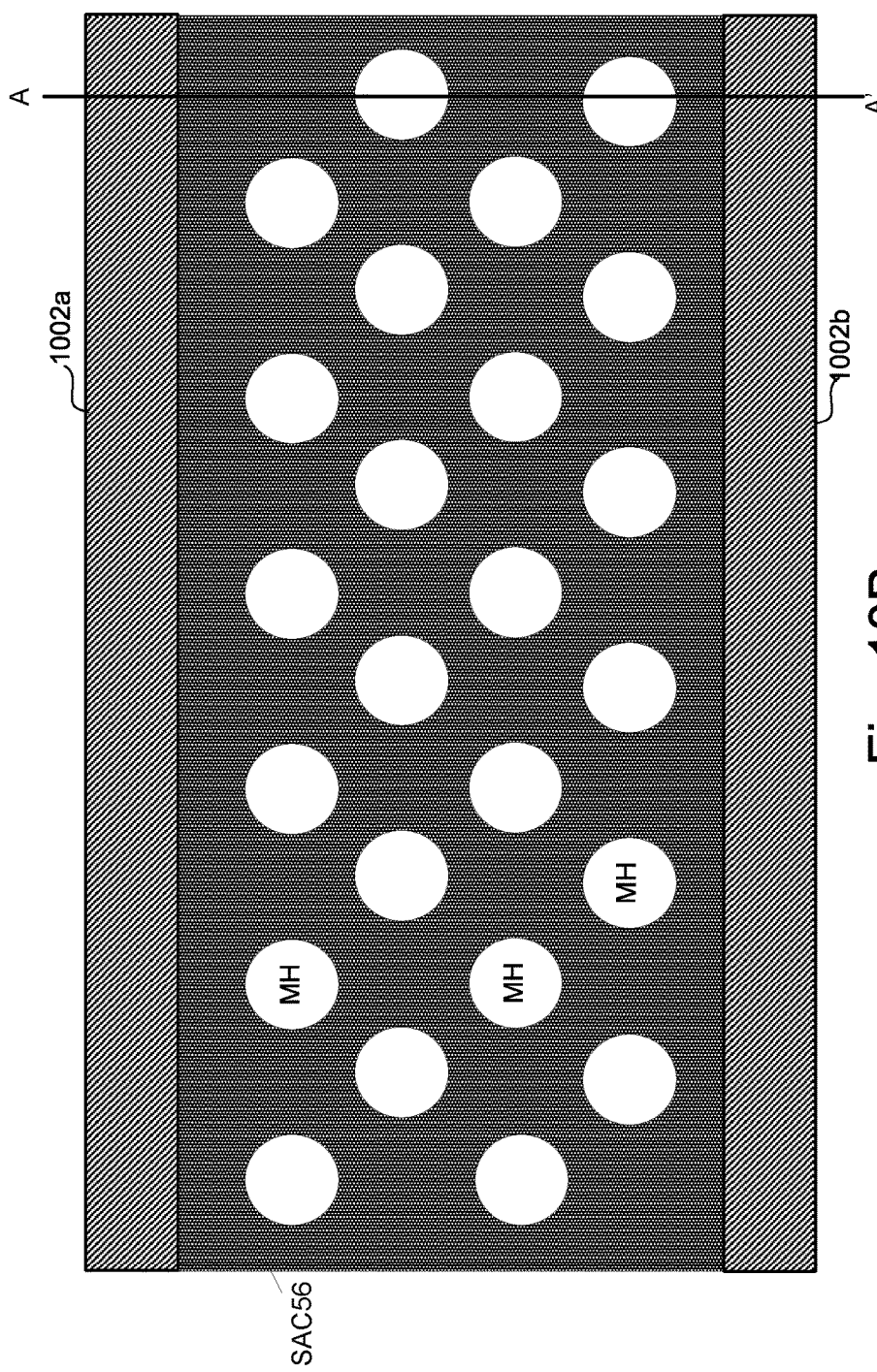

FIG. 10B shows a cross sectional view of sacrificial layer SAC56 from FIG. 10A after step 1008, showing one possible pattern for the memory holes (MH). This is not the only possible pattern. For example, the memory holes do not need to be staggered as depicted. An x-y-z coordinate system is depicted, showing the direction of formation. Note that line A-A' indicates that FIG. 10A is a cross section along line A-A' of FIG. 10B. Also note that the memory holes have a circular cross section in the horizontal direction (e.g., x-y plane), in this example. The memory holes are not required to be circular in cross section. Note that the memory holes could be of different diameter in the different layers. For example, the memory holes could have a smaller diameter at the lower layers. FIG. 10B shows that the insulation filled slits 1002a, 1002b extend in the x-direction.

Step 910 includes growing a pillar of crystalline semiconductor within the memory hole over the semiconductor substrate 201. Step 910 includes epitaxial growth, in some embodiments. For example, when the semiconductor substrate 201 is a single crystal silicon substrate, the substrate 201 may act as a seed crystal, wherein the substrate 201 locks into one or one crystallographic orientations with respect to the single crystal silicon substrate. The semiconductor substrate 201 could be formed from a semiconductor other than silicon. The pillar may be in direct contact with the semiconductor substrate 201, or there could be one or more intervening layers.

Figure 10C:
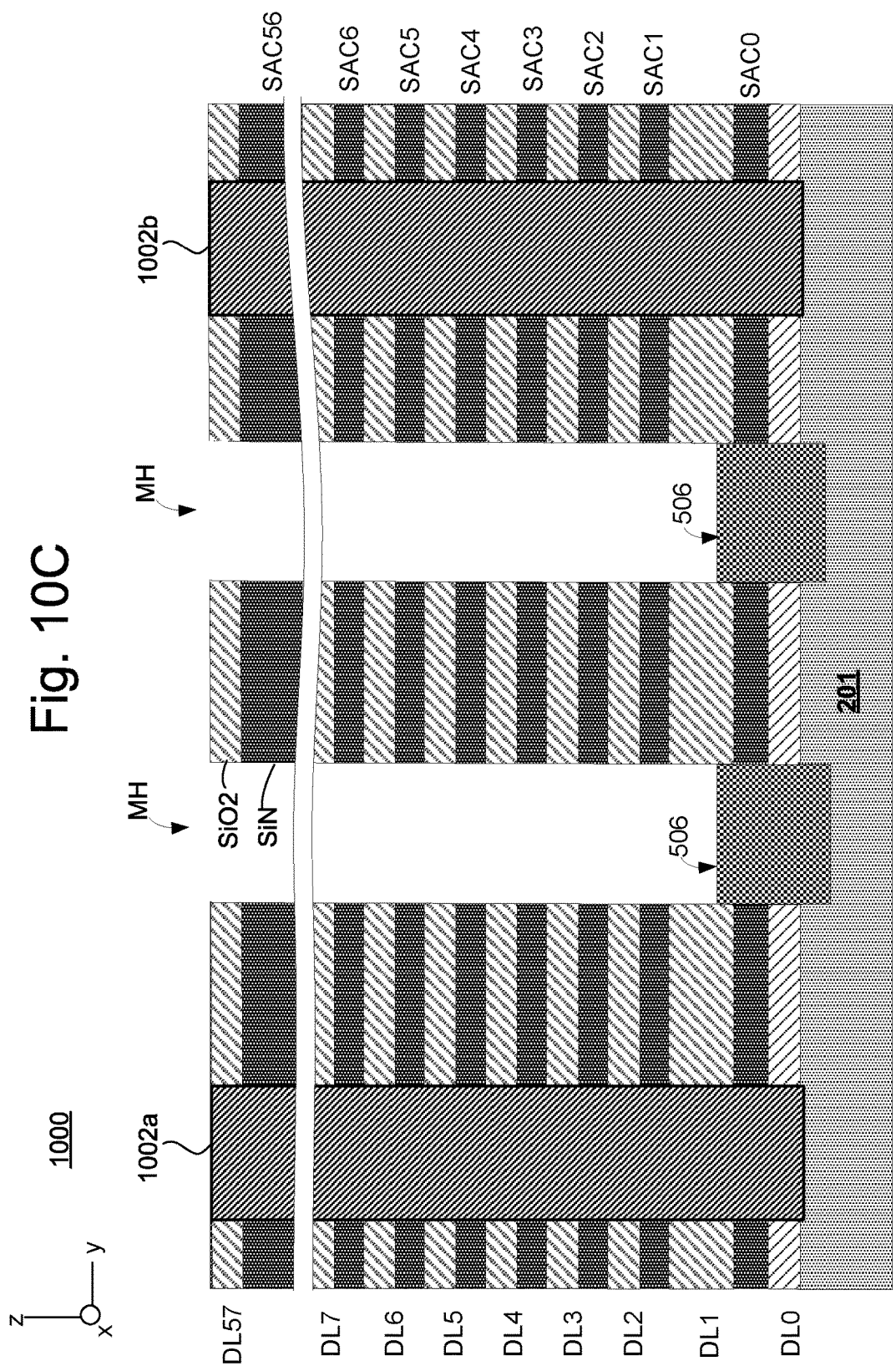

FIG. 10C depicts results after one embodiment of step 910, showing a pillar 506 of crystalline semiconductor in the bottom of the memory holes (MR). Note that crystalline semiconductor will serve as the body 506 of the source side select transistor, and hence is referenced in FIG. 10C accordingly. The crystalline semiconductor 506 may cover the vertical sidewalls of the memory holes near the bottom (e.g., at DL0, sacrificial layer SAC0, and part of DL1). The pillar of crystalline semiconductor 506 is in direct contact with a single crystal semiconductor substrate, in one embodiment.

Steps 912-924 describe one embodiment for forming a memory cell film in the memory hole over the pillar of crystalline semiconductor. Some of the steps may include forming successive conformal layers of thin film. In one embodiment, layers such as depicted in FIGS. 5C, 5D, 6A, 6B, and 7B are formed in the memory hole.

In step 912, a conformal layer of SiO$_2$ is formed for a blocking layer 478. Formation of this layer can be implemented with atomic layer deposition (ALD), chemical vapor deposition (CVD), but is not so limited. The conformal layer of SiO$_2$ may cover the top of the semiconductor body 506.

In step 914, a conformal layer of nitride for charge trapping layer 473 is formed on the conformal layer of SiO$_2$. In one embodiment, a nitride such as SiN be deposited as charge trapping layer 473. The charge trapping layer 473 can be formed, for example, by chemical vapor deposition (CVD), atomic layer deposition (ALD), physical vapor deposition (PVD), or any suitable deposition technique.

In step 916, tunnel dielectric 472 is deposited as a conformal layer on the charge trapping layer 473. Thus, the tunnel dielectric 472 may cover vertical sidewalls of the charge trapping layer 473, as well as the portion of the charge trapping layer 473 that is on the body 506. The tunnel dielectric 472 can be formed, for example, by chemical vapor deposition (CVD), atomic layer deposition (ALD), physical vapor deposition (PVD), or any suitable deposition technique.

In one embodiment, forming tunneling dielectric 472 may include depositing multiple layers, such as $SiO_2$ and SiON, with the $SiO_2$ nearest the charge trapping region (e.g., SiN). The tunnel dielectric might also include $SiO_2$ and ISSG (in-situ steam generation) formed oxide, with the $SiO_2$ nearest the charge trapping region. The tunnel dielectric might also include three layers: $SiO_2$, SiON, and ISSG formed oxide.

Step 918 is to deposit a protective layer over the tunnel dielectric layers. In one embodiment, a layer of silicon oxide is deposited. This may be deposited using CVD or ALD, as two examples. The silicon oxide may be about 5 nm in thickness. However, it could be thicker or thinner. The protective layer may serve to protect the tunnel dielectric during later etching steps.

Step 920 includes etching at the bottom of the memory holes to expose the semiconductor body 506. In one embodiment, this is a reactive ion etch (ME). Step 920 may include one or more anisotropic etch processes to sequentially etched various layers. The etch may include zero or more isotropic etch processes and zero or more anisotropic etch processes.

Step 922 is a post wet etch clean. This step removes of the protective layer (from step 918). In one embodiment, a wet etch is used to remove the silicon oxide protective layer. Also polymer residues from the etch of step 920 are etched away.

Figure 10D:
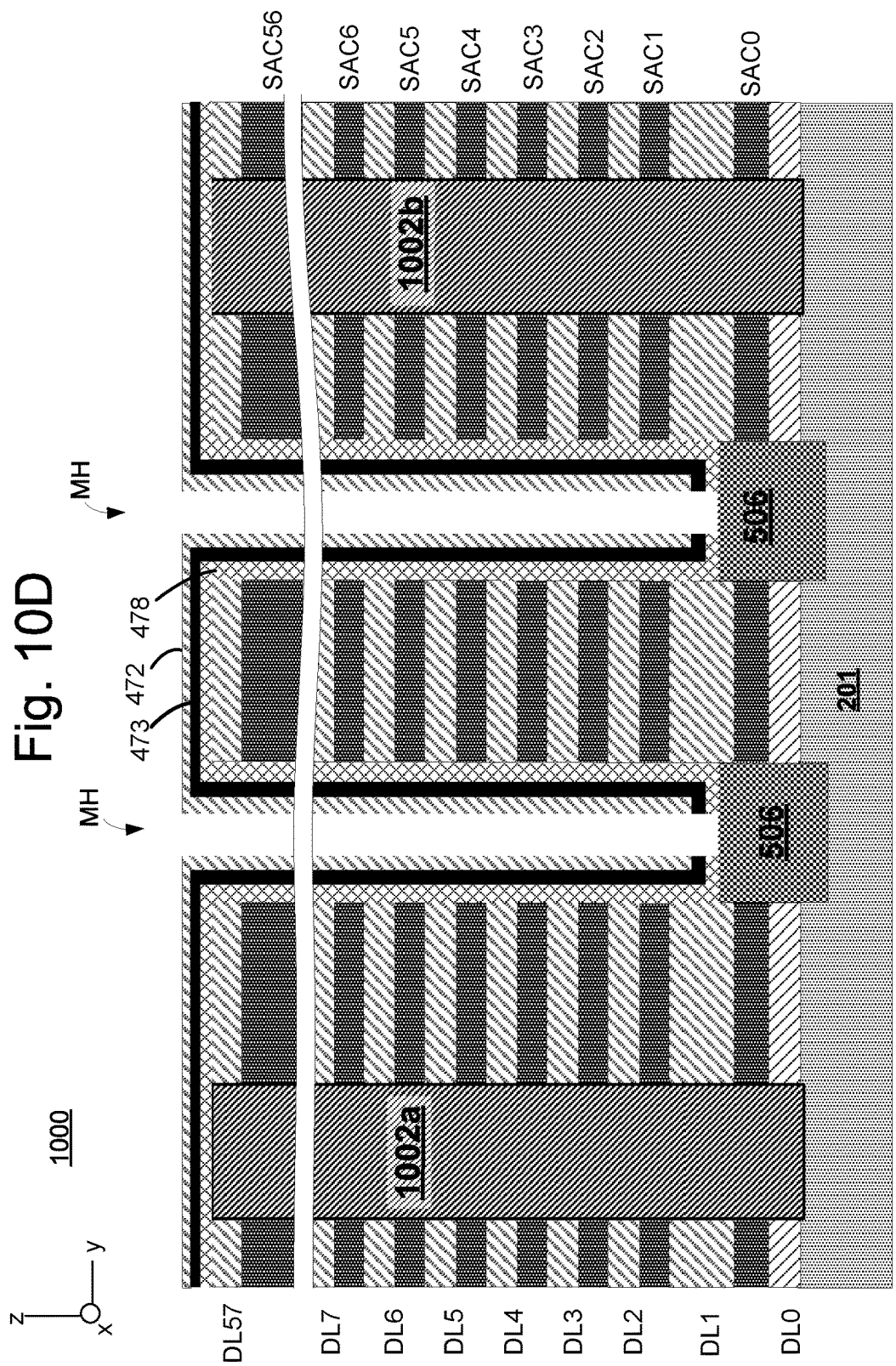

FIG. 10D shows results after etching to expose the solid pillar of crystalline semiconductor 506. The etching has created a gap in the memory cell film at the bottom of the memory holes to expose the top of semiconductor body 506. The etching has gone through the horizontal portion of tunnel dielectric layer(s) 472, through horizontal portion of the charge trapping layer 473, and through horizontal portion of the silicon oxide 478 at the bottom of the memory holes.

Figure 10E:
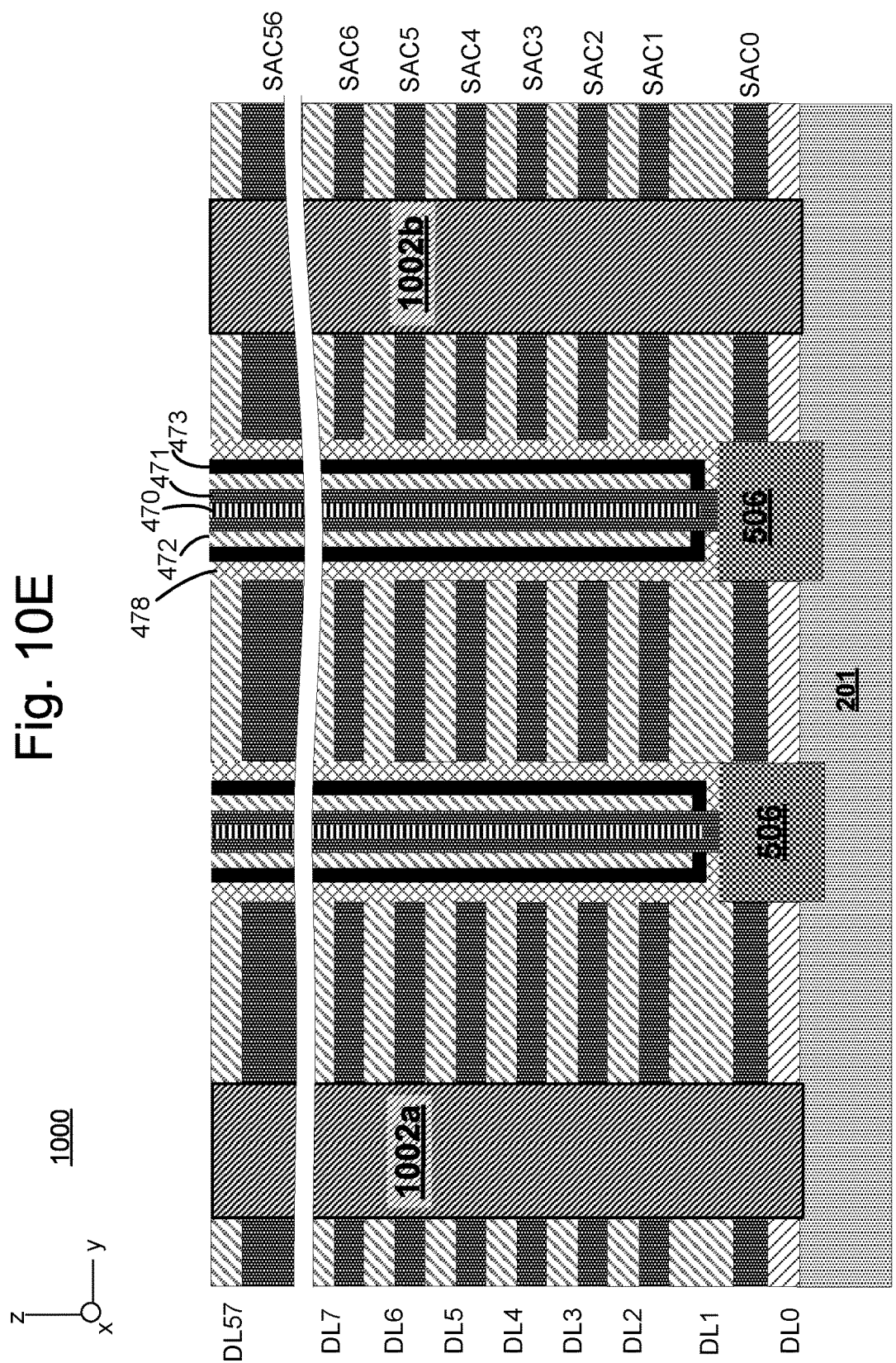

Step 924 includes forming semiconductor in the memory holes for semiconductor channel 471. The semiconductor is silicon, in one embodiment. However, a different semiconductor such as SiGe, a III-V material might be used instead. Formation of the semiconductor can be implemented with atomic layer deposition (ALD), chemical vapor deposition (CVD), but is not so limited. A core of silicon oxide may then be formed in step 926 for inner core 470. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. FIG. 10E depicts results after one embodiment of step 908.

Step 926 is an optional step of forming a dielectric core inside of the semiconductor channel 471. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Step 928 is to remove a horizontal portion of the memory film outside of the memory holes. The horizontal portion of various layers can be removed, for example, by a recess etch or a chemical mechanical planarization (CMP).

Step 930 is to etch the slits 1002. This removes the material that was in the slits and is done to allow removal of the sacrificial silicon nitride and to deposit metal.

Step 932 includes performing an etch via the slits to selectively remove the lowermost sacrificial layer (e.g., SAC0). The etch can involve introducing an etchant via the slits, which has a higher selectivity for the lowermost sacrificial layer, removing the lowermost sacrificial layer. However, the other sacrificial layers are not removed. It is acceptable if the other sacrificial layers etch to some extent. The etch is not relatively highly selective of the silicon oxide layers so that the silicon oxide layers are not substantially removed. In one embodiment, step 932 is a wet etch.

In one embodiment, the lowermost sacrificial layer (e.g., SAC0) is amorphous silicon, the other sacrificial layer are silicon nitride, and the other layers in the stack 1000 are silicon oxide. The etch in step 932 is not relatively highly selective of the silicon oxide so that the silicon oxide is not substantially removed. Also, the etch is not relatively highly selective of silicon nitride in this embodiment, so that the other sacrificial layers are not removed. The etch is selective for the amorphous silicon such that the lowermost sacrificial layer is removed. The etch could be a wet etch or a dry etch. For one embodiment of a wet etch process, trimethyl ammonium hydroxide (TMAH) wet chemical is used to selectively etch the amorphous silicon layer. In the case of dry etch process, a chemical dry etch (CDE) process can be used to selectively remove the amorphous silicon layer with respect to sacrificial silicon nitride layers. In one embodiment, the Frontier® CDE system from Applied Materials, Inc. is used.

In one embodiment, the lowermost sacrificial layer (e.g., SAC0) is silicon nitride that has been processed in a manner to etch faster than the other silicon nitride sacrificial layers. Examples of such processing have been discussed in step 902. For example, the lowest sacrificial silicon nitride has at least 5% higher hydrogen content than the other sacrificial layers of silicon nitride, in one embodiment. The etch in step 932 removes the silicon nitride in the lowermost sacrificial layer while leaving at least a portion of the silicon nitride for the other sacrificial layers in place. Also, the etch is not relatively highly selective of silicon oxide, so that the silicon oxide layers are not removed.

Figure 10F:
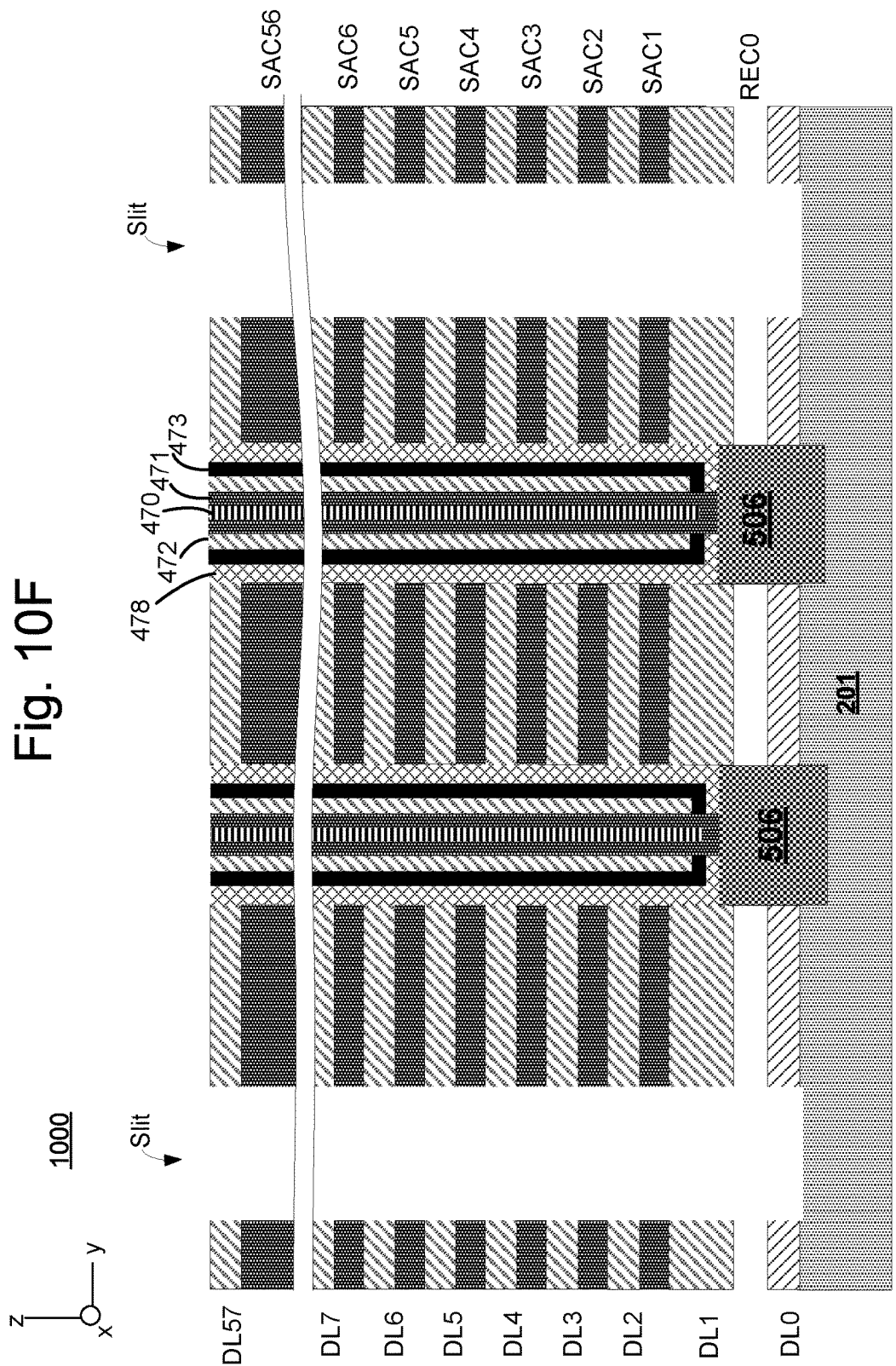

FIG. 10F depicts results after one embodiment of step 932. FIG. 10F shows that the insulation has been removed from the slits. Also, the lowermost sacrificial layer (SAC0) has been removed leaving a horizontal recess where the sacrificial layers previously was. The material in the memory holes may serve as an anchor to hold the dielectric layers in place. What was sacrificial layer (SAC0) is now labeled recess layer (REC0).

In step 934, an impurity is introduced into the slits to dope the substrate 201 below the slits. An example impurity for the n+ region is Arsenic. An example doping concentration for the n+ region is $1 \times 10^{20}/cm^3$.

Figure 10G:
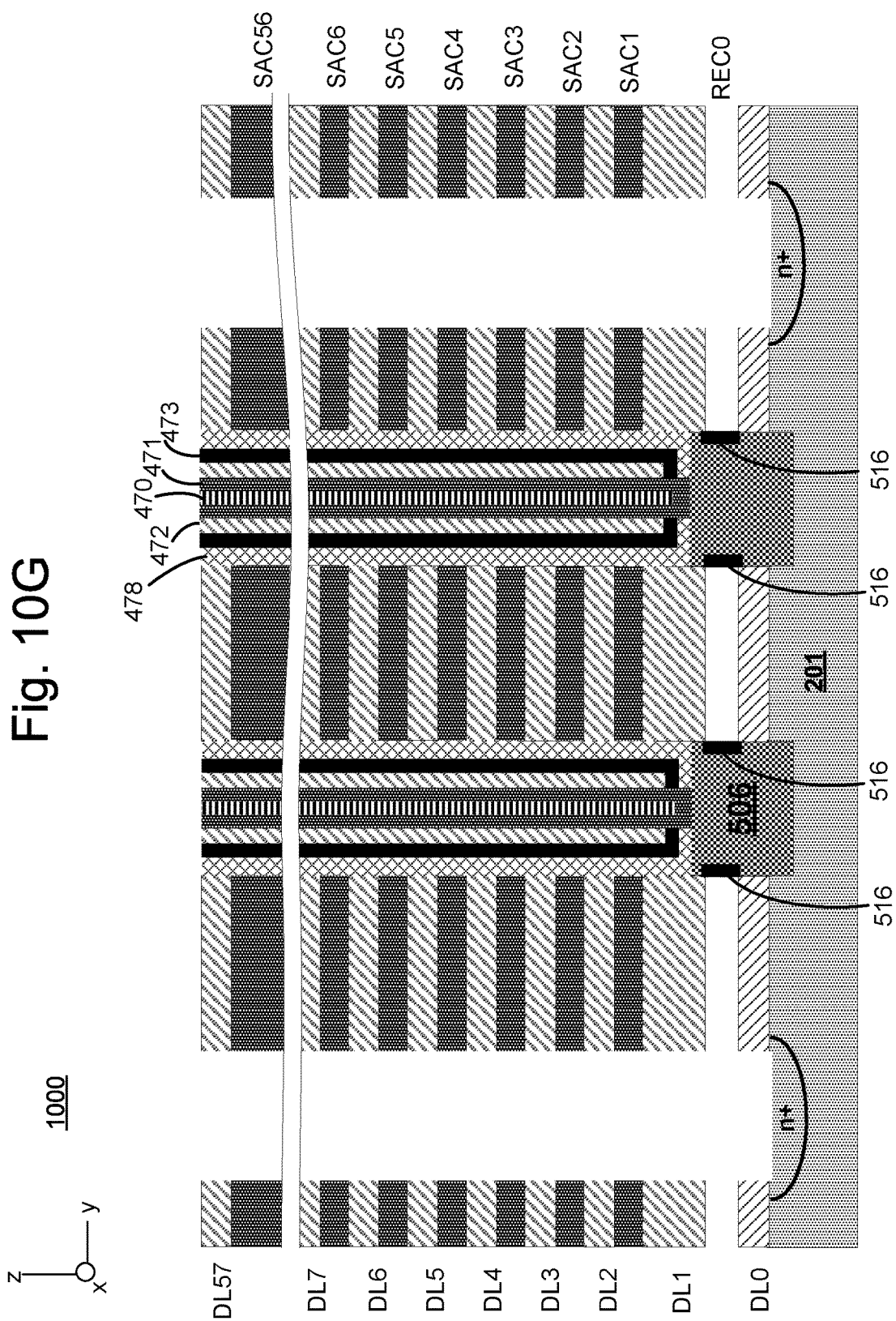

Step 936 includes forming a gate dielectric from the crystalline semiconductor in the recess. Step 936 may include oxidation of sidewalls of the pillar of crystalline semiconductor 506 to form gate oxides. Step 936 includes a water vapor generator (WVG) oxidation process, in one embodiment. Step 936 may include converting a surface portions of the crystalline semiconductor 506 into a semiconductor oxide portion, a semiconductor nitride portion, or a semiconductor oxynitride portion by oxidation, nitridation, or a combination of oxidation and nitridation, of the physically exposed portions of the semiconductor body 506. For example, step 936 may include converting a surface portions of crystalline silicon 506 into a silicon oxide portion, a silicon nitride portion, or a silicon oxynitride portion by oxidation, nitridation, or a combination of oxidation and nitridation, of the physically exposed portions of a silicon body 506. The gate dielectric 516 may laterally surround a respective semiconductor body 506. FIG. 10G depicted results after one embodiment of step 936. A gate dielectric region 516 is depicted on sidewall of the body 506. Note that gate dielectric region 516 may be ring shaped, as in FIG. 5D.

Step 938 includes depositing material for a conductive floating gate in the recess on the sidewall of the pillar of crystalline semiconductor 506. Step 938 includes depositing silicon in the bottom recess (RCE0), in one embodiment. The silicon may be amorphous, as deposited. The silicon may be doped to increase its conductivity. The doping may be performed as the silicon is being deposited, or after deposit. In some embodiments, a thermal anneal is performed at some point to form polysilicon from the deposited silicon. Another material could be deposited for the conductive floating gate instead of silicon. For example, a metal might be deposited.

Figure 10H:
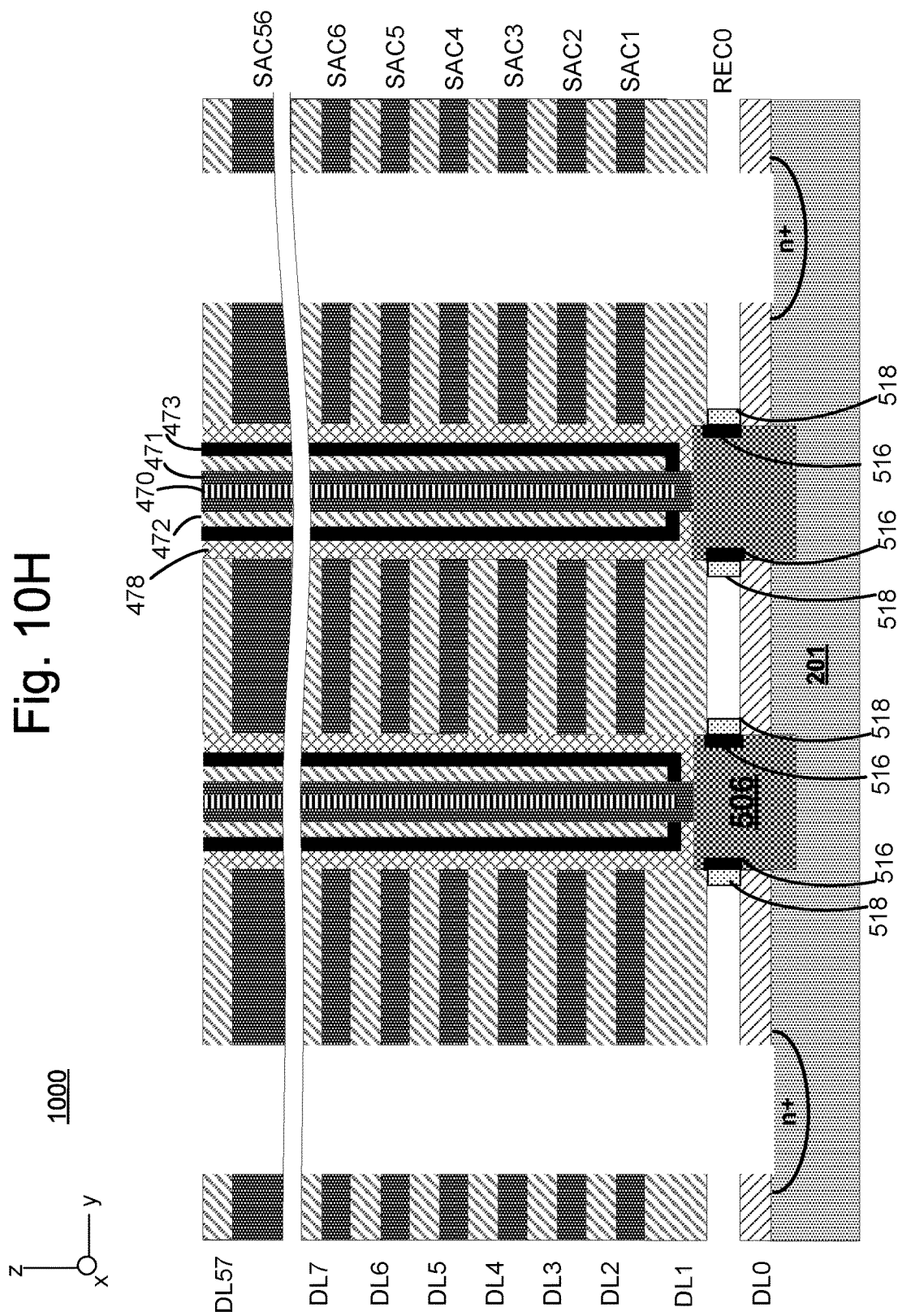

FIG. 10H depicts results after one embodiment of step 914, showing the material for the conductive floating gate 518 deposited on the body 506. In this example, the conductive floating gate 518 is formed on the gate dielectric region 516. Note that the conductive floating gate 518 may surround the body, as in the embodiment of FIG. 5D.

Figure 10I:
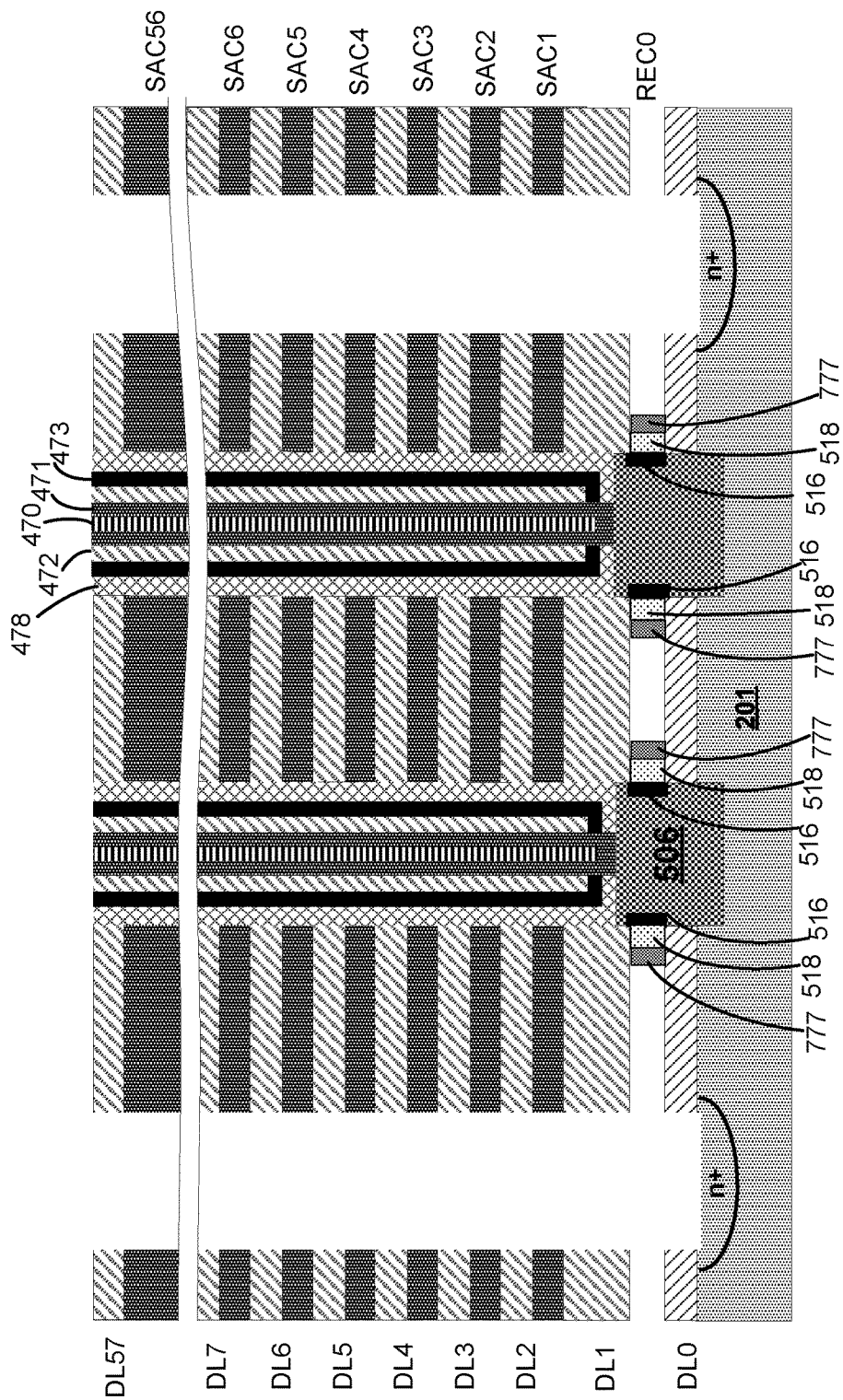

Optional step 940 includes forming a dielectric in the recess and adjacent to the conductive floating gate. This is a high-k dielectric, in some embodiments. In one embodiment, silicon oxide is deposited, followed by silicon nitride, followed by silicon oxide. In one embodiment, aluminum oxide is deposited. FIG. 10I depicts results after one embodiment of step 916, showing the dielectric material 777. Note that the dielectric material 777 may surround the conductive floating gate 518. Note that step 940 is not required in that the later deposited block layer (step 944) may serve as the inter-gate dielectric.

Step 942 includes removing the other sacrificial layers. Step 942 includes performing an etch via the slits to remove portions of the silicon nitride layers, in one embodiment. The etch can involve introducing an etchant via the slits, which has a higher selectivity for the silicon nitride, removing the silicon nitride layers. The wet etch is not relatively highly selective of the silicon oxide so that the silicon oxide is not substantially removed. The etch may have a relatively higher selectivity (e.g., by a factor of 1000, or more generally, 100 or more) for the silicon nitride relative than for the silicon oxide. Also note that the etch should not remove the NAND strings.

The wet etch should remove essentially the entire silicon nitride layers wherein the NAND strings are being formed (memory cell area), so that when the regions of the removed silicon nitride are replaced in at least part by metal, the metal will extend in substantially the entire layer in the memory cell area. Thus, word line layers at different levels should be isolated from one another and not shorted together. This applies regardless of the etch method, e.g., whether the etchant is introduced via the slits, memory holes, other holes or voids, or combinations thereof. The NAND strings in the memory holes serve as anchors which support the silicon oxide layers when the silicon nitride is removed by etching through slits.

A variety of etching techniques may be used to etch the silicon nitride. Nitride can be etched in one embodiment, by heated or hot phosphoric acid ($H_3PO_4$). As an example, the boiling point of phosphoric acid varies with the concentration of the acid. For example, for a range of acid concentration between 79.5%-104.5% the boiling point may vary from 140° C.-200° C. The etch rate of silicon nitride varies with the temperature and the concentration of the acid. Since the bath is operated at high temperature, water readily evaporates from the solution and the concentration of phosphoric acid changes. Therefore, this may be considered to be a type of "wet" etch. However, a wet etch is not necessarily needed for nitride, as other etching techniques may be applied. In other embodiments, the sacrificial material in the stack may be something other than silicon nitride. Therefore a different type of etch process and etchant may be used.

Figure 10J:
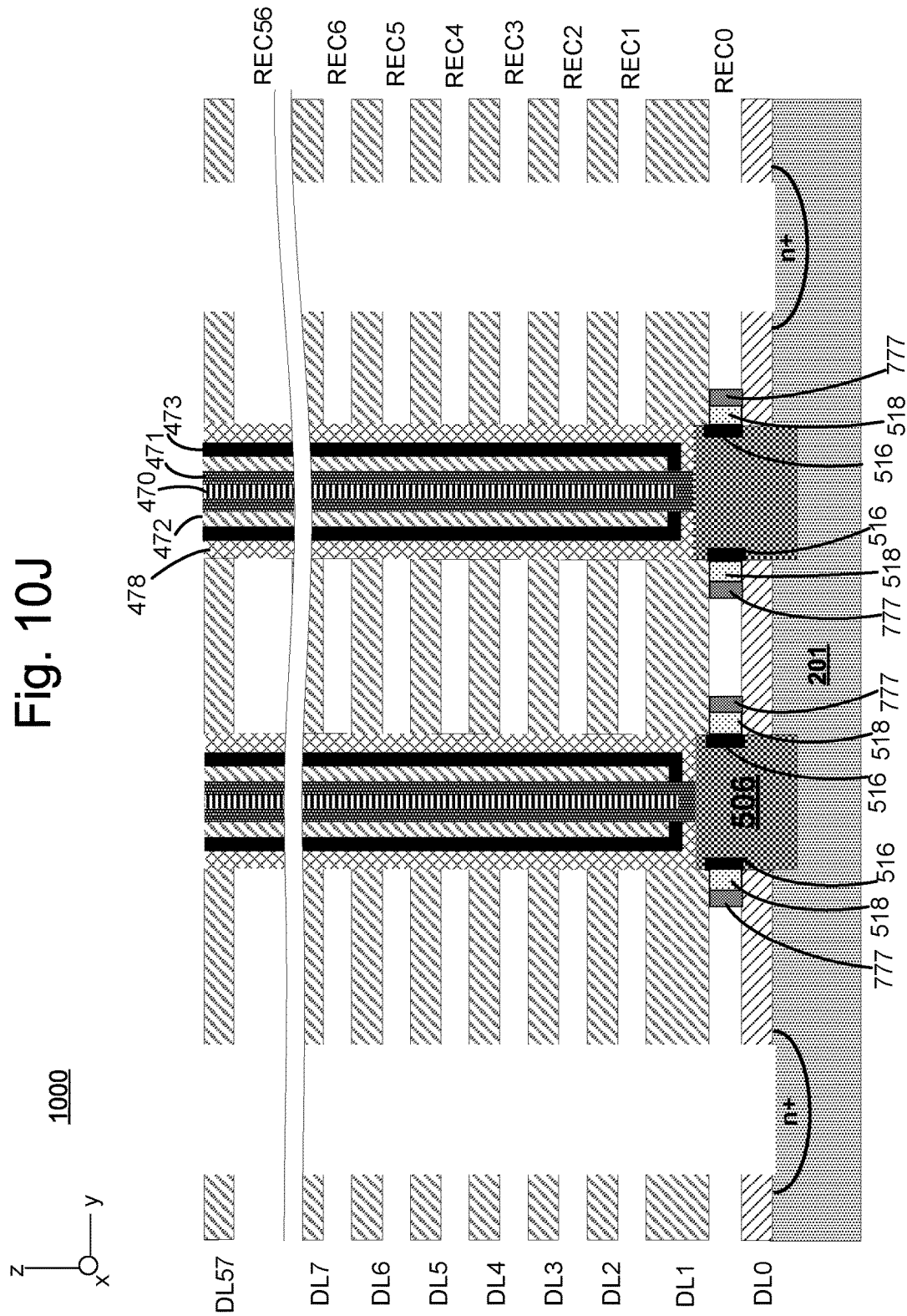

FIG. 10J depicts results after one embodiment of step 942. FIG. 10J shows that all sacrificial layers have now been removed. The material in the memory holes may serve as an anchor to hold the dielectric layers in place.

In optional step 944, a portion of the blocking layer is formed in the recesses. This portion of the blocking layer is an $Al_2O_3$ layer, in one embodiment. This portion of blocking layer may be deposited by ALD from outside of the memory hole through the slits.

Step 946 includes depositing metal (e.g., one or more layers) in the recesses via the slits. In one embodiment, the metal is tungsten. This forms a metal/oxide stack. Metal is provided in the slits to fill the recesses left when the sacrificial material was removed. Chemical vapor deposition (CVD) or atomic layer deposition (ALD) could be used to deposit the metal.

Step 948 is forming material in the slits for the local source lines (also referred to as local interconnects). Step 948 may include depositing an insulating layer in the slits to cover vertical sidewalls of the slits. Initially, the insulating layer may also cover the substrate at the bottom of the slits. The insulating layer in a slit may be etched to create an opening for the source line. The substrate 201 is exposed as a result of etching the insulating layer, in one embodiment. Step 948 may include depositing one or more conductive fill materials in the slits. The conductive fill materials serve as the source lines. For example, a first conductive fill material can include a doped semiconductor material such as doped polysilicon. The first conductive fill material might be used in the lower portion of the slits. A second conductive fill material can include at least one metallic material such as a combination of a conductive metallic nitride material (such as TiN) and a metal (such as W, Co, or Ru). Step 944 may also include one or more etching steps to remove excess fill material (for both the first and second fill material).

Figure 10K:
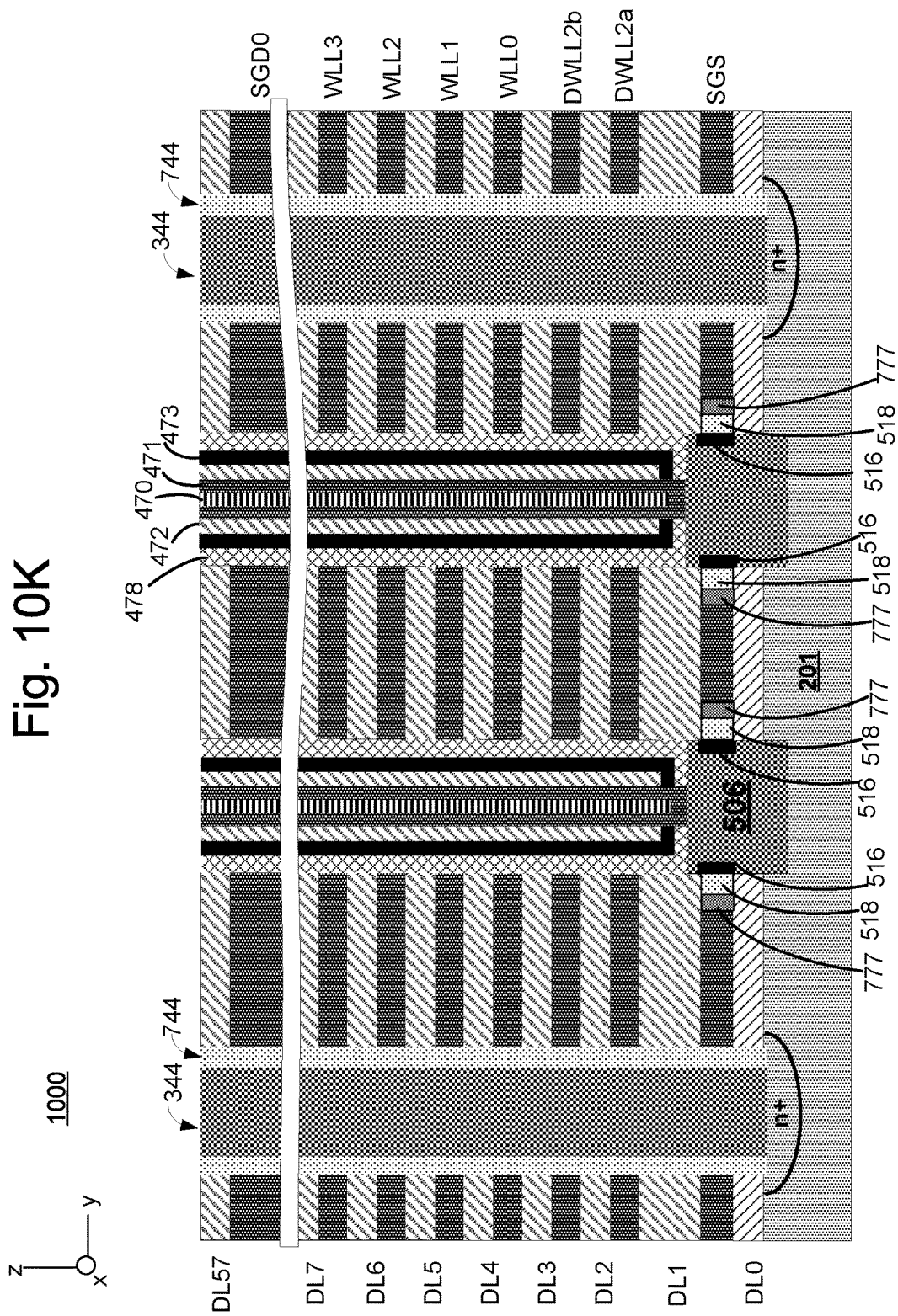

FIG. 10K depicts results after one embodiment of step 948. The recesses in the stack have been filled with a conductive material. Thus, the recess layers are re-labeled as SGS, DWLL2a, DWLL2b, WLL0, WLL1, WLL2, WLL3, and SGD0. As the aluminum oxide layer was described as being optional, it is not depicted in FIG. 10K. However, in one embodiment, there is an aluminum oxide layer 477 outside of the memory holes, as in FIG. 4C.

The source lines 344 are now formed in the slits. An insulating layer 744 provides electrical insulation between the source lines 344 and the conductive layers (SGS, DWLL2a, DWLL2b, WLL0, WLL1, WLL2, WLL3, and SGD0).

Figure 11:
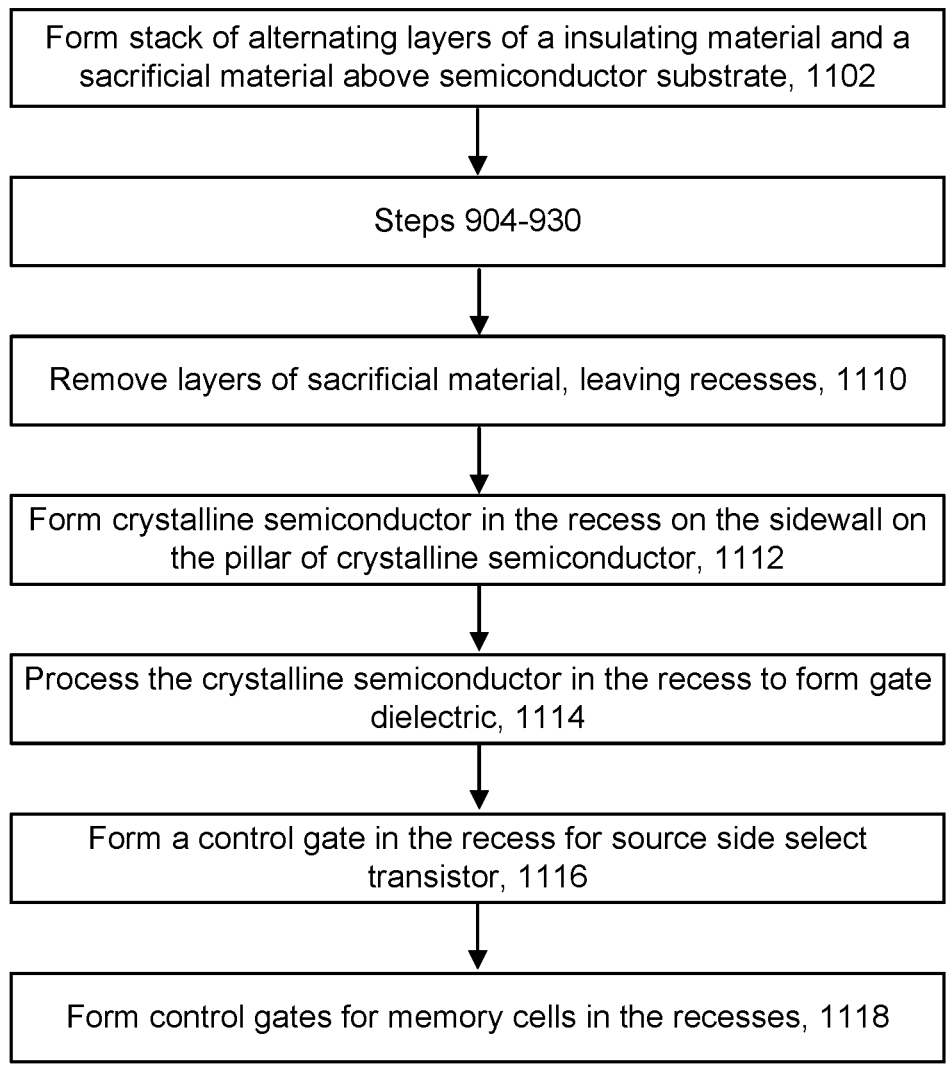
FIG. 11 is a flowchart of one embodiment of a process of fabricating a 3D memory array.

FIG. 11 is a flowchart of one embodiment of a process 1100 of fabricating a 3D memory array. Process 1100 is used to form a select transistor in 3D memory. In process 1100 a gate dielectric for the select transistor is formed in a recess adjacent to the body. Also formed is a string of memory cells in a 3D memory array. The process 1100 may be used to fabricate devices such as, but not limited to, those depicted in FIGS. 2A, 2C, 3, 4B, 4C, 5A, 5B, 6A, 6B, and 7A. The process 110 forms a select transistor in 3D memory having a uniform vertical gate dielectric, in one embodiment. The uniform vertical gate dielectric helps to prevent or reduce current leakage during device operation. Note that not all process steps are described. For example, some etching, cleaning, doping, and/or annealing steps may be omitted. Some steps may be similar to those of process 900, and will not be described in detail. FIGS. 12A-12F depict results after embodiments of various steps of process 1100.

In step 1102, a stack of alternating layers of insulating material and sacrificial material are formed above a semiconductor substrate. This step may be similar to step 902 in which the lowest layer of sacrificial material has a different etch selectivity than that other layers of sacrificial material. However, it is not required that the lowest sacrificial layer has a different etch selectivity than that other layers of sacrificial material. In one embodiment, the insulating material is silicon oxide and the sacrificial material is silicon nitride.

Steps 904-930 may be similar to those of process 900.

Figure 12A:
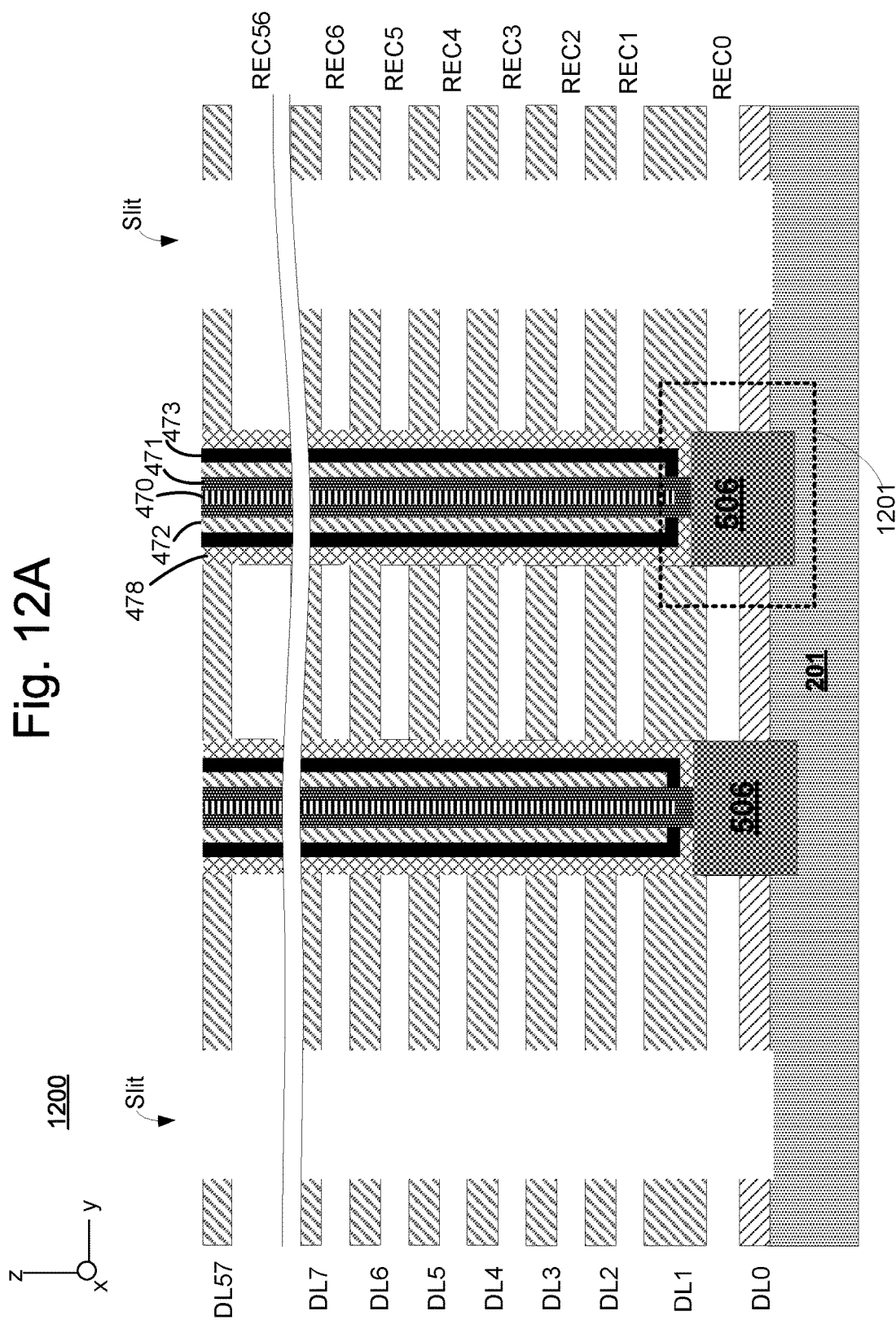

Step 1110 includes removing the layers of sacrificial material, leaving recesses. FIG. 12A depicts results after one embodiment of step 1110. FIG. 12A shows that the insulation has been removed from the slits. Also, the silicon nitride in the sacrificial layers has been removed leaving horizontal recesses (REC0-REC56) where the sacrificial layers previously were. The material in the memory holes may serve as an anchor to hold the dielectric layers in place.

Step 1110 includes performing an etch via the slits to remove portions of the silicon nitride layers, in one embodiment. The etch can involve introducing an etchant via the slits, which has a higher selectivity for the silicon nitride, removing the silicon nitride layers. The wet etch is not relatively highly selective of the silicon oxide so that the silicon oxide is not substantially removed. The etch may have a relatively higher selectivity (e.g., by a factor of 1000, or more generally, 100 or more) for the silicon nitride relative than for the silicon oxide. Also note that the etch should not remove the NAND strings.

The wet etch should remove essentially the entire silicon nitride layers wherein the NAND strings are being formed (memory cell area), so that when the regions of the removed silicon nitride are replaced in at least part by metal, the metal will extend in substantially the entire layer in the memory cell area. Thus, word line layers at different levels should be isolated from one another and not shorted together. This applies regardless of the etch method, e.g., whether the etchant is introduced via the slits, memory holes, other holes or voids, or combinations thereof. The NAND strings in the memory holes serve as anchors which support the silicon oxide layers when the silicon nitride is removed by etching through slits.

A variety of etching techniques may be used to etch the silicon nitride. Nitride can be etched in one embodiment, by heated or hot phosphoric acid ($H_3PO_4$). As an example, the boiling point of phosphoric acid varies with the concentration of the acid. For example, for a range of acid concentration between 79.5%-94.5% the boiling point may vary from 140° C.-200° C. The etch rate of silicon nitride varies with the temperature and the concentration of the acid. Since the bath is operated at high temperature, water readily evaporates from the solution and the concentration of phosphoric acid changes. Therefore, this may be considered to be a type of "wet" etch. However, a wet etch is not necessarily needed for nitride, as other etching techniques may be applied. In other embodiments, the sacrificial material in the stack may be something other than silicon nitride. Therefore a different type of etch process and etchant may be used.

Step 1112 includes forming crystalline semiconductor in the recess on the sidewall of the pillar of crystalline semiconductor 506. Step 1112 includes lateral epitaxial growth, using the exposed sidewall of the pillar of crystalline semiconductor 506 as a crystalline substrate, in one embodiment.

Figure 12C:
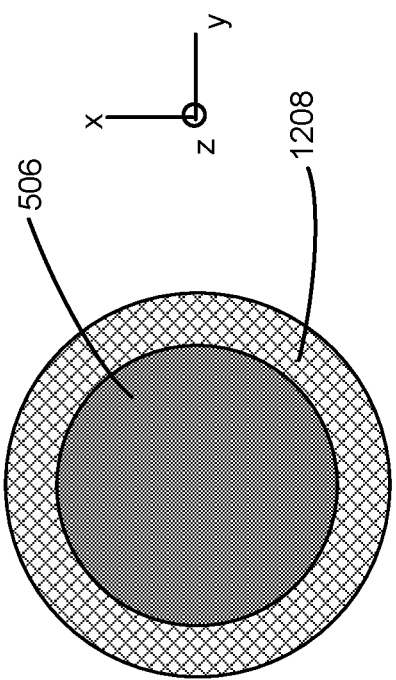

FIG. 12B depicts results after one embodiment of step 1112. FIG. 12B shows a close up of region 1201 from FIG. 12A. FIG. 12C depicts a cross section along line 1202 of FIG. 12B. FIG. 12B depicts crystalline semiconductor 1208 on the vertical sidewall of pillar of crystalline semiconductor 506. In one embodiment, crystalline semiconductor 1208 is crystalline silicon. This may be single crystal silicon, but that is not a requirement.

Step 1114 includes processing the crystalline semiconductor in the recess to form a gate dielectric. Step 1114 may include oxidation of crystalline semiconductor in the recess to form a gate oxide. Step 1114 includes a water vapor generator (WVG) oxidation process, in one embodiment. Step 1114 may include converting crystalline semiconductor in the recess into a semiconductor oxide portion, a semiconductor nitride portion, or a semiconductor oxynitride portion by oxidation, nitridation, or a combination of oxidation and nitridation, of the physically exposed portions of the semiconductor body 506. For example, step 1114 may include converting at least a portion of the crystalline semiconductor in the recess into a silicon oxide portion, a silicon nitride portion, or a silicon oxynitride portion by oxidation, nitridation, or a combination of oxidation and nitridation, of the crystalline semiconductor in the recess.

Figure 12E:
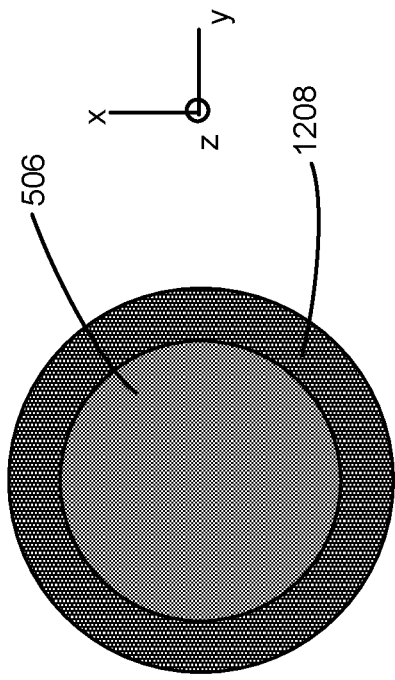

FIG. 12D depicts results after one embodiment of step 1114. FIG. 12E depicts a cross section along line 1202 of FIG. 12D. The crystalline semiconductor 1208 has been converted to the gate dielectric region 508, as described with respect to step 1114.

Step 1116 includes forming a control gate for the source side select transistor in the bottom recess. Step 1118 includes forming control gates for the memory cells in the other recesses. In one embodiment, the control gates of the source side select transistor and the memory cells are made from a combination of TiN and Tungsten. In other embodiments, other materials can be used to form the control gates, such as doped polysilicon, metal such as Tungsten or metal silicide.

Figure 12F:
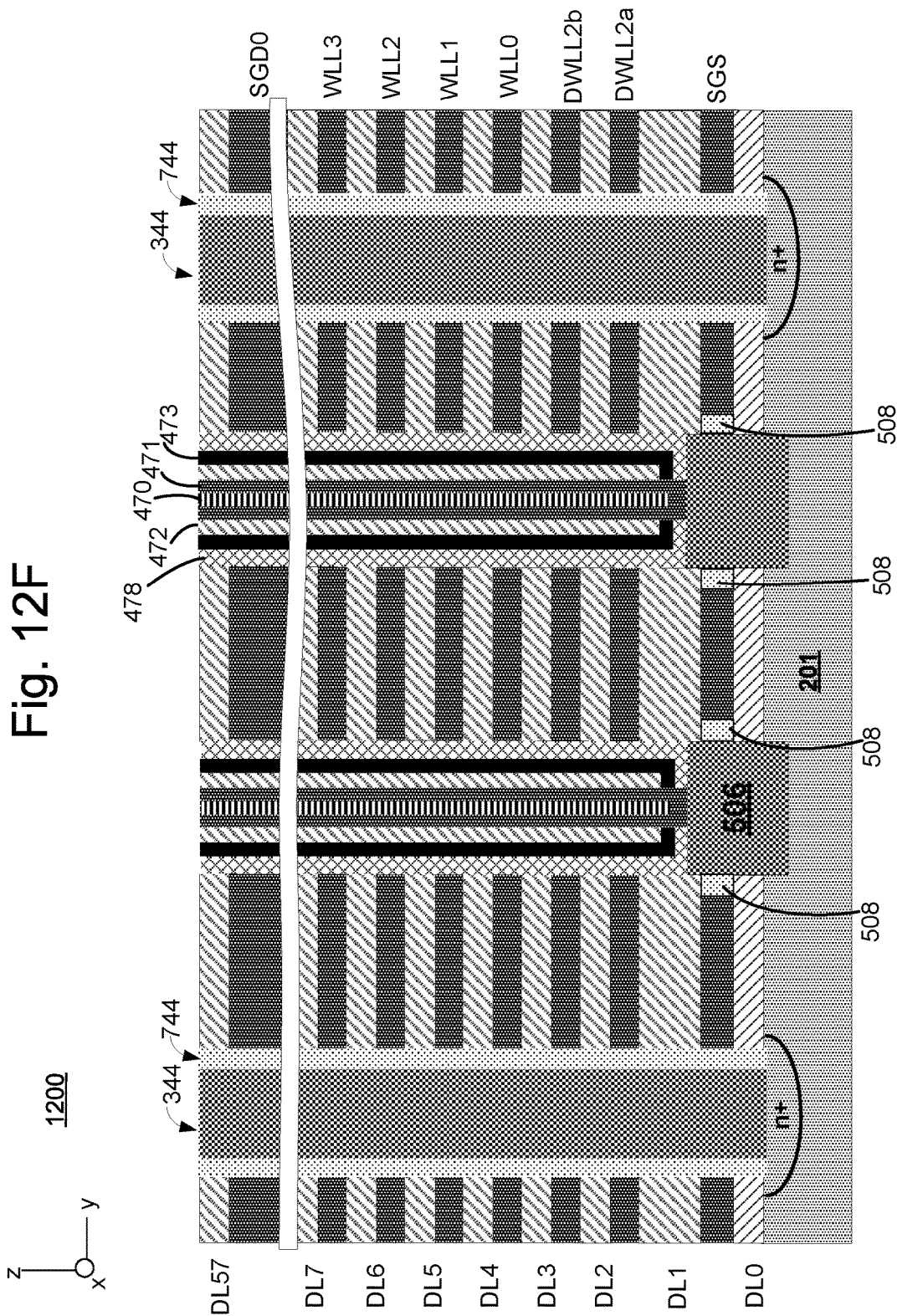

FIG. 12F depicts results after one embodiment of step 1118. The control gates may be formed by depositing metal (e.g., one or more layers) in the recesses via the slits. In one embodiment, the metal is tungsten. This forms a metal/oxide stack. Metal is provided in the slits to fill the recesses left when the sacrificial material was removed. Chemical vapor deposition (CVD) or atomic layer deposition (ALD) could be used to deposit the metal.

In one embodiment, a portion of the blocking layer is formed in the recesses prior to forming the control gates. This portion of the blocking layer is an $Al_2O_3$ layer, in one embodiment. This portion of blocking layer may be deposited by ALD from outside of the memory hole through the slits.

The common source lines may be formed by depositing an insulating layer in the slits to cover vertical sidewalls of the slits. Initially, the insulating layer may also cover the substrate at the bottom of the slits. The insulating layer in a slit may be etched to create an opening for the source line. The substrate 201 is exposed as a result of etching the insulating layer, in one embodiment. One or more conductive fill materials may be deposited in the slits. The conductive fill materials serve as the source lines. For example, a first conductive fill material can include a doped semiconductor material such as doped polysilicon. The first conductive fill material might be used in the lower portion of the slits. A second conductive fill material can include at least one metallic material such as a combination of a conductive metallic nitride material (such as TiN) and a metal (such as W, Co, or Ru). One or more etching steps can be performed to remove excess fill material (for both the first and second fill material).

FIG. 12F depicts results after one embodiment of step 1118. Every other layer of the stack has been filled with a conductive material. Thus, the recess layers are re-labeled as SGS, DWLL2a, DWLL2b, WLL0, WLL1, WLL2, WLL3, and SGD0. As the aluminum oxide layer was described as being optional, it is not depicted in FIG. 12F. However, in one embodiment, there is an aluminum oxide layer 477 outside of the memory holes, as in FIG. 4C.

The source lines 344 are now formed in the slits. An insulating layer 744 provides electrical insulation between the source lines 344 and the conductive layers (SGS, DWLL2a, DWLL2b, WLL0, WLL1, WLL2, WLL3, and SGD0).

One embodiment disclosed herein includes an apparatus comprising a semiconductor substrate having a major surface, a select transistor, and a string of memory cells that extends vertically with respect to the major surface of the semiconductor substrate. The select transistor has a body formed from a solid pillar of semiconductor in contact with the semiconductor substrate, a conductive floating gate, a conductive control gate, a first dielectric between the conductive floating gate and the conductive control gate, and a second dielectric between the body and the conductive floating gate. The string has a string channel, wherein the body of the select transistor is in contact with the string channel.

One embodiment disclosed herein includes a method of fabricating a 3D memory array, which comprising forming a select transistor adjacent to a semiconductor substrate having a major surface, and forming a string of memory cells that extends vertically with respect to the major surface of the semiconductor substrate. Forming the select transistor comprises forming a solid pillar of semiconductor in contact with the semiconductor substrate, forming a gate dielectric adjacent the solid pillar of semiconductor, forming a conductive floating gate adjacent the gate dielectric, forming an inter-gate dielectric adjacent the conductive floating gate, and forming a conductive control gate adjacent the blocking dielectric. Forming the string of memory cells comprises forming a channel of the string in contact with the solid pillar of semiconductor of the select transistor.

One embodiment disclosed herein includes a method of fabricating a 3D memory array, comprising: forming a plurality of alternating layers of insulator material and sacrificial material above a semiconductor substrate; forming an opening through the alternating layers of the insulator material and the sacrificial material to the semiconductor substrate; forming a pillar of crystalline semiconductor in a bottom of the opening in contact with the semiconductor substrate to form a body of a select transistor; removing a layer of the sacrificial material to form a recess that exposes a sidewall of the pillar of crystalline semiconductor; forming crystalline semiconductor in the recess on the sidewall of the pillar of crystalline semiconductor; processing the crystalline semiconductor in the recess to form a gate dielectric of a select transistor; forming a conductor in the recess adjacent to the gate dielectric to form a control gate of the select transistor; and forming a memory cell film in the opening above the crystalline semiconductor.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A method of fabricating a 3D memory array, comprising:
    forming a plurality of alternating layers of insulator material and sacrificial material above a semiconductor substrate;
    forming an opening through the alternating layers of the insulator material and the sacrificial material to the semiconductor substrate;
    forming a pillar of crystalline semiconductor in a bottom of the opening in contact with the semiconductor substrate to form a body of a select transistor;
    removing a layer of the sacrificial material to form a recess that exposes a sidewall of the pillar of crystalline semiconductor;
    forming crystalline semiconductor on the exposed sidewall of the pillar of crystalline semiconductor;
    processing the crystalline semiconductor that was formed on the exposed sidewall to form a gate dielectric of the select transistor;
    forming a conductor in the recess adjacent to the gate dielectric to form a control gate of the select transistor; and
    forming a memory cell film in the opening above the pillar of crystalline semiconductor.

2. The method of claim 1, wherein processing the crystalline semiconductor comprises converting a portion of the crystalline semiconductor that was formed on the exposed sidewall into a semiconductor oxide.

3. The method of claim 1, wherein processing the crystalline semiconductor comprises converting a portion of the crystalline semiconductor that was formed on the exposed sidewall into a semiconductor nitride.

4. The method of claim 1, wherein processing the crystalline semiconductor comprises converting a portion of the crystalline semiconductor that was formed on the exposed sidewall into a semiconductor oxynitride.

5. The method of claim 1, wherein processing the crystalline semiconductor comprises oxidizing a portion of the crystalline semiconductor that was formed on the exposed sidewall.

6. The method of claim 1, wherein processing the crystalline semiconductor comprises performing nitridation on a portion of the crystalline semiconductor that was formed on the exposed sidewall.

7. The method of claim 1, wherein forming the crystalline semiconductor on the exposed sidewall of the pillar of crystalline semiconductor comprises:
 epitaxially growing the crystalline semiconductor on the exposed sidewall of the pillar of crystalline semiconductor.

8. The method of claim 1, wherein forming the memory cell film in the opening above the pillar of crystalline semiconductor comprises:
 forming a vertical NAND string.

9. The method of claim 1, further comprising:
 forming a layer of aluminum oxide in the recess after processing the crystalline semiconductor and prior to forming the conductor in the recess.

10. The method of claim 1, wherein forming the crystalline semiconductor on the exposed sidewall of the pillar of crystalline semiconductor forms single crystal semiconductor on the exposed sidewall of the pillar of crystalline semiconductor.

11. A method of fabricating vertical NAND strings in a 3D memory array, comprising:
 forming a stack that comprises a plurality of alternating layers of insulator material and sacrificial material above a silicon substrate;
 forming memory hole openings through the alternating layers of the insulator material and the sacrificial material to the silicon substrate;
 forming a pillar of crystalline silicon in a bottom of each of the memory hole openings in contact with the silicon substrate to form a body of a select transistor in each of the memory hole openings;
 forming a memory cell film in each of the memory hole openings above the pillar of crystalline silicon;
 etching slits in the stack of the alternating layers of the insulator material and the sacrificial material;
 performing an etch through the slits to remove the layers of the sacrificial material to form recesses in the stack, wherein a sidewall of each of the pillars of crystalline silicon is exposed in a recess;
 performing lateral epitaxial growth with the exposed sidewall of each of the pillars of crystalline silicon as a crystalline substrate to form crystalline silicon on the exposed sidewall of each of the pillars of crystalline silicon;
 processing the crystalline silicon that was formed on the exposed sidewall of each of the pillars of crystalline silicon to form one or more of silicon oxide, silicon nitride, or silicon oxynitride;
 forming a control gate for each of the select transistors in a recess that was formed from removing a first layer of the sacrificial material; and
 forming control gates for memory cells of vertical NAND strings, the control gates being formed in recesses from removing other layers of the sacrificial material than the first layer.

12. The method of claim 11, wherein processing the crystalline silicon that was formed on the exposed sidewall of each of the pillars of crystalline silicon forms silicon oxide from at least a portion of the crystalline silicon that was formed on the exposed sidewall of each of the pillars of crystalline silicon.

13. The method of claim 11, wherein processing the crystalline silicon that was formed on the exposed sidewall of each of the pillars of crystalline silicon forms silicon nitride from at least a portion of the crystalline silicon that was formed on the exposed sidewall of each of the pillars of crystalline silicon.

14. The method of claim 11, wherein processing the crystalline silicon that was formed on the exposed sidewall of each of the pillars of crystalline silicon forms silicon oxynitride from at least a portion of the crystalline silicon that was formed on the exposed sidewall of each of the pillars of crystalline silicon.

15. A method of fabricating a vertical NAND string in 3D memory array, comprising:
 forming a plurality of alternating layers of silicon oxide and silicon nitride above a crystalline semiconductor substrate;
 forming a memory hole opening through the alternating layers of the silicon oxide and the silicon nitride to the crystalline semiconductor substrate;
 forming a pillar of crystalline semiconductor in a bottom of the memory hole opening in contact with the crystalline semiconductor substrate to form a body of a source side select transistor for the vertical NAND string;
 removing a bottom layer of the silicon nitride to form a bottom recess that exposes a sidewall of the pillar of crystalline semiconductor;
 forming crystalline semiconductor on the exposed sidewall of the pillar of crystalline semiconductor;
 processing the crystalline semiconductor that was formed on the exposed sidewall of the pillar of crystalline semiconductor to form a gate dielectric of the source side select transistor;
 forming a control gate for the source side select transistor in the bottom recess; and
 forming a memory cell film in the memory hole for memory cells for the vertical NAND string.

16. The method of claim 15, wherein processing the crystalline semiconductor that was formed on the exposed sidewall of the pillar of crystalline semiconductor comprises converting a portion of the crystalline semiconductor into semiconductor oxide.

17. The method of claim 15, wherein processing the crystalline semiconductor that was formed on the exposed sidewall of the pillar of crystalline semiconductor comprises converting a portion of the crystalline semiconductor into semiconductor nitride.

18. The method of claim 15, wherein processing the crystalline semiconductor that was formed on the exposed sidewall of the pillar of crystalline semiconductor comprises converting a portion of the crystalline semiconductor into semiconductor oxynitride.

19. The method of claim 15, wherein forming the crystalline semiconductor on the exposed sidewall of the pillar of crystalline semiconductor comprises:
 epitaxially growing the crystalline semiconductor on the exposed sidewall of the pillar of crystalline semiconductor.

20. The method of claim 15, wherein forming the crystalline semiconductor on the exposed sidewall of the pillar of crystalline semiconductor forms single crystal silicon.

* * * * *